United States Patent
Won et al.

(10) Patent No.: US 11,181,673 B2
(45) Date of Patent: Nov. 23, 2021

(54) OPTICAL FILTER, AND CAMERA MODULE AND ELECTRONIC DEVICE COMPRISING THE SAME

(71) Applicant: Samsung Electronics Co., Ltd., Suwon-si (KR)

(72) Inventors: Jong Hoon Won, Yongin-si (KR); Changki Kim, Suwon-si (KR); Hyung Jun Kim, Suwon-si (KR); Yong Joo Lee, Suwon-si (KR); Myungsup Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 410 days.

(21) Appl. No.: 16/175,022

(22) Filed: Oct. 30, 2018

(65) Prior Publication Data

US 2019/0129078 A1 May 2, 2019

(30) Foreign Application Priority Data

Nov. 1, 2017 (KR) .......................... 10-2017-0144897

(51) Int. Cl.
*G02B 1/04* (2006.01)
*G02B 1/11* (2015.01)
(Continued)

(52) U.S. Cl.
CPC ................ *G02B 5/208* (2013.01); *C08K 3/08* (2013.01); *C08K 5/235* (2013.01); *C08K 5/3417* (2013.01);
(Continued)

(58) Field of Classification Search
CPC . G02B 1/04; G02B 1/11; G02B 5/208; C08K 3/08; C08K 5/52; C08K 5/235; C08K 5/3517; H01L 27/307
See application file for complete search history.

(56) References Cited

U.S. PATENT DOCUMENTS 5,973,158 A 10/1999 Usami et al.
6,542,292 B2 4/2003 Onomichi et al.
(Continued)

FOREIGN PATENT DOCUMENTS

CN 1300948 A 6/2001
CN 101238135 A 8/2008
(Continued)

OTHER PUBLICATIONS

Extended European Search Report dated Mar. 20, 2019, issued in corresponding European Patent Application No. 18203345.
(Continued)

*Primary Examiner* — Bijan Ahvazi
(74) *Attorney, Agent, or Firm* — Harness, Dickey & Pierce, P.L.C.

(57) ABSTRACT

Disclosed are an optical filter including a near infrared absorption layer on a polymer film. The polymer film has a* of about −5.0 to about +5.0 and b* of about −5.0 to about +5.0 in a color coordinate expressed by a CIE Lab color space. The near infrared absorption layer may be configured to transmit light in a visible region and to selectively absorb at least one part of light in a near infrared region. The near infrared absorption layer includes a first near infrared absorption material including a copper phosphate ester compound and a second near infrared absorption material including at least two different organic dyes. The second near infrared absorption material has a maximum absorption wavelength ($\lambda_{max}$) in a wavelength region of about 650 nm to about 1200 nm. An electronic device may include the optical filter.

27 Claims, 17 Drawing Sheets

(51) Int. Cl.
    *G02B 5/20*          (2006.01)
    *C08K 3/08*          (2006.01)
    *C08K 5/23*          (2006.01)
    *C08K 5/52*          (2006.01)
    *C08K 5/3417*       (2006.01)
    *G02B 5/22*          (2006.01)
    *C09B 23/08*        (2006.01)
    *C09B 57/00*        (2006.01)
    *C09B 53/02*        (2006.01)
    *H01L 27/30*        (2006.01)
    *H01L 51/44*        (2006.01)

(52) U.S. Cl.
    CPC ................ *C08K 5/52* (2013.01); *C09B 23/08* (2013.01); *C09B 53/02* (2013.01); *C09B 57/00* (2013.01); *C09B 57/007* (2013.01); *G02B 1/04* (2013.01); *G02B 1/11* (2013.01); *G02B 5/223* (2013.01); *C08K 2003/085* (2013.01); *H01L 27/307* (2013.01); *H01L 51/44* (2013.01)

(56) References Cited

U.S. PATENT DOCUMENTS

| | | | |
|---|---|---|---|
| 8,227,712 | B2 | 7/2012 | Seo et al. |
| 8,853,211 | B2 | 10/2014 | Dorsch et al. |
| 9,376,426 | B2 | 6/2016 | Dorsch et al. |
| 10,082,611 | B2 | 9/2018 | Shiono et al. |
| 10,495,796 | B2 | 12/2019 | Shiono et al. |
| 10,901,123 | B2 | 1/2021 | Arayama et al. |
| 2001/0005278 | A1 | 6/2001 | Onomichi et al. |
| 2005/0148786 | A1 | 7/2005 | Ikeda et al. |
| 2006/0286381 | A1 | 12/2006 | Naito et al. |
| 2010/0222302 | A1 | 9/2010 | Hubschwerlen et al. |
| 2014/0061505 | A1 | 3/2014 | Steppel et al. |
| 2015/0124152 | A1 | 5/2015 | Bak et al. |
| 2015/0130008 | A1* | 5/2015 | Muro ................ H01L 27/14621 257/432 |
| 2015/0260889 | A1 | 9/2015 | Shiono et al. |
| 2017/0184765 | A1 | 6/2017 | Shiono et al. |
| 2018/0017720 | A1* | 1/2018 | Arimura .................. G02B 5/22 |
| 2018/0067243 | A1* | 3/2018 | Shiono .................. C09B 57/007 |
| 2018/0188428 | A1* | 7/2018 | Arimura ................. H01L 27/14 |

FOREIGN PATENT DOCUMENTS

| | | | | |
|---|---|---|---|---|
| CN | 102272125 | A | 12/2011 | |
| CN | 104583819 | A | 4/2015 | |
| CN | 104838294 | A | 8/2015 | |
| CN | 105308124 | A | 2/2016 | |
| EP | 1111410 | A2 | 6/2001 | |
| JP | 2004-117545 | A | 4/2004 | |
| JP | 2010-192621 | A | 9/2010 | |
| JP | 5312816 | B2 | 10/2013 | |
| JP | 5358976 | B2 | 12/2013 | |
| JP | 2014040509 | A * | 3/2014 | ....... H01L 27/14618 |
| JP | 2015-172004 | A | 10/2015 | |
| KR | 100702182 | B1 | 4/2007 | |
| KR | 2009-0127618 | A | 12/2009 | |
| KR | 101129113 | B1 | 3/2012 | |
| KR | 2016-0013991 | A | 2/2016 | |
| KR | 2017-0007365 | A | 1/2017 | |
| TW | 201408673 | A | 3/2014 | |
| WO | WO-2014030444 | A1 | 2/2014 | |
| WO | WO-2017/130825 | A1 | 8/2017 | |

OTHER PUBLICATIONS

Anonymous, "Organophosphate—Wikipedia" accessed Feb. 28, 2019, p. 1, URL: https://en.wikipedia.org/wiki/Organophosphate.

Anonymous, "Illustrated Glossary of Organic Chemistry—Phosphate ester (organophosphate)" accessed Feb. 28, 2019, p. 1, URL: http://www.chem.ucla.edu/~harding/IGOC/P/phosphate_ester.html.

Office Action dated Aug. 16, 2021 in Chinese Application No. 201811293755.X.

L. Stackova et al. 'Deciphering the Structure-Property Relations in Substituted Heptamethine Cyanines' The Journal of Organic Chemistry, 2020, vol. 85, No. 15, pp. 9776-9790.

* cited by examiner

OPTICAL FILTER, AND CAMERA MODULE AND ELECTRONIC DEVICE COMPRISING THE SAME

CROSS-REFERENCE TO RELATED APPLICATION

This application claims priority to and the benefit of Korean Patent Application No. 10-2017-0144897 filed in the Korean Intellectual Property Office on Nov. 1, 2017, the entire contents of which are incorporated herein by reference.

BACKGROUND

1. Field

An optical filter and a camera module and an electronic device including the same are disclosed.

2. Description of the Related Art

Recently, an electronic device including an image sensor that stores an image as an electrical signal, such as a cell phone, a digital camera, a camcorder and a camera, has been widely used.

This electronic device may include an optical filter having near infrared ray absorption capability in order to reduce or prevent generation of an optical distortion by light in the other regions than a visible region.

This optical filter in general is mounted in front of an image sensor of a camera module and thus plays a role of effectively absorbing an incident near infrared ray and resolving the optical distortion phenomenon.

Recently, several attempts to make the optical filter into a thin film corresponding to a demand on down-sizing, higher integration, and the like of an electronic device and particularly, a couple of attempts to replace a glass substrate for a conventional optical filter with a plastic substrate have been made.

The above plastic substrate may a contribute little to thinning the optical filter but cause a flare phenomenon where a border around a subject is seen (a wifi-type flare phenomenon), light around the subject is spread or glimmered (a petal-type flare phenomenon), or the like, when the subject with high luminance is observed or imaged.

This flare phenomenon is an optical distortion caused according as an image sensor in an electronic device senses light in a visible ray wavelength region along with an infrared ray or near infrared ray wavelength region.

SUMMARY

Some example embodiments provide an optical filter capable of reducing and/or minimizing an optical distortion phenomenon of an image sensor and being made into a thin film and in addition, a camera module and an electronic device including the optical film and capable of reducing and/or minimizing an optical distortion of an image.

According to some example embodiments, an optical filter includes a polymer film having a* of about −5.0 to about +5.0 and b* of about −5.0 to about +5.0 in a color coordinate expressed by a CIE Lab color space; and a near infrared absorption layer on the polymer film. The near infrared absorption layer is configured to transmit light in a visible region and to selectively absorb at least one part of light in a near infrared region. The near infrared absorption layer includes a first near infrared absorption material and a second near infrared absorption material. The first near infrared absorption material includes a copper phosphate ester compound. The second near infrared absorption material includes at least two different organic dyes. The second near infrared absorption material has a maximum absorption wavelength ($\lambda$max) in a wavelength region of about 650 nm to about 1200 nm.

In some example embodiments, the optical filter may have an average light transmittance of less than or equal to about 25% in a wavelength region of about 700 nm to about 1200 nm.

In some example embodiments, the optical filter may have an average light transmittance of less than or equal to about 5% in a wavelength region of about 700 nm to about 740 nm and the optical filter may have an average light transmittance of less than or equal to about 25% in a wavelength region of about 1000 nm to about 1200 nm.

In some example embodiments, the optical filter may have an average light transmittance of greater than or equal to about 80% in a wavelength region of about 430 nm to about 565 nm.

In some example embodiments, the second near infrared absorption material may include a binder. The at least two organic dyes of the second near infrared absorption material may include an organic dye represented by Chemical Formula 1, and at least one of an organic dye represented by Chemical Formula 2 or an organic dye represented by Chemical Formula 3.

[Chemical Formula 1]

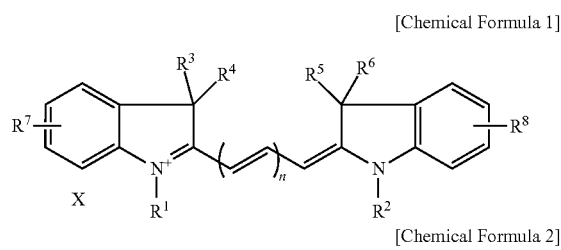

[Chemical Formula 2]

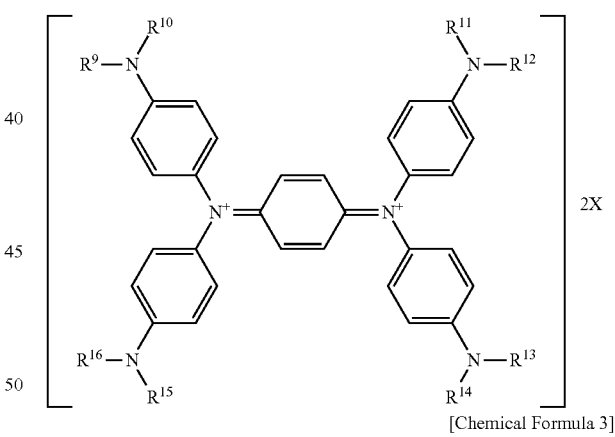

[Chemical Formula 3]

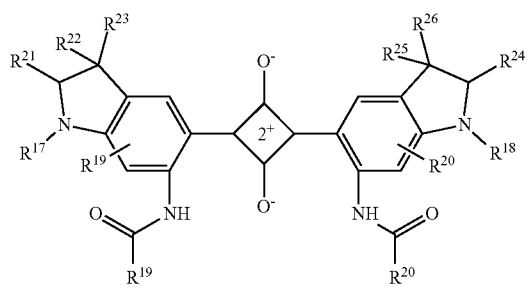

In Chemical Formula 1, Chemical Formula 2, and Chemical Formula 3, $R^1$ to $R^{26}$ may independently be a hydrogen atom, a substituted or unsubstituted C1 to C20 alkyl group, or a substituted or unsubstituted C6 to C20 aryl group; X may be one of $PF_6^-$, $BF_4^-$, $ClO_4^-$, $I^-$, or a borate-based anion; and n may be an integer ranging from 1 to 10.

In some example embodiments, the organic dye represented by Chemical Formula 1 may include one or more structures represented by at least one of Chemical Formula 1a, Chemical Formula 1b, Chemical Formula 1c, Chemical Formula 1d, or Chemical Formula 1e.

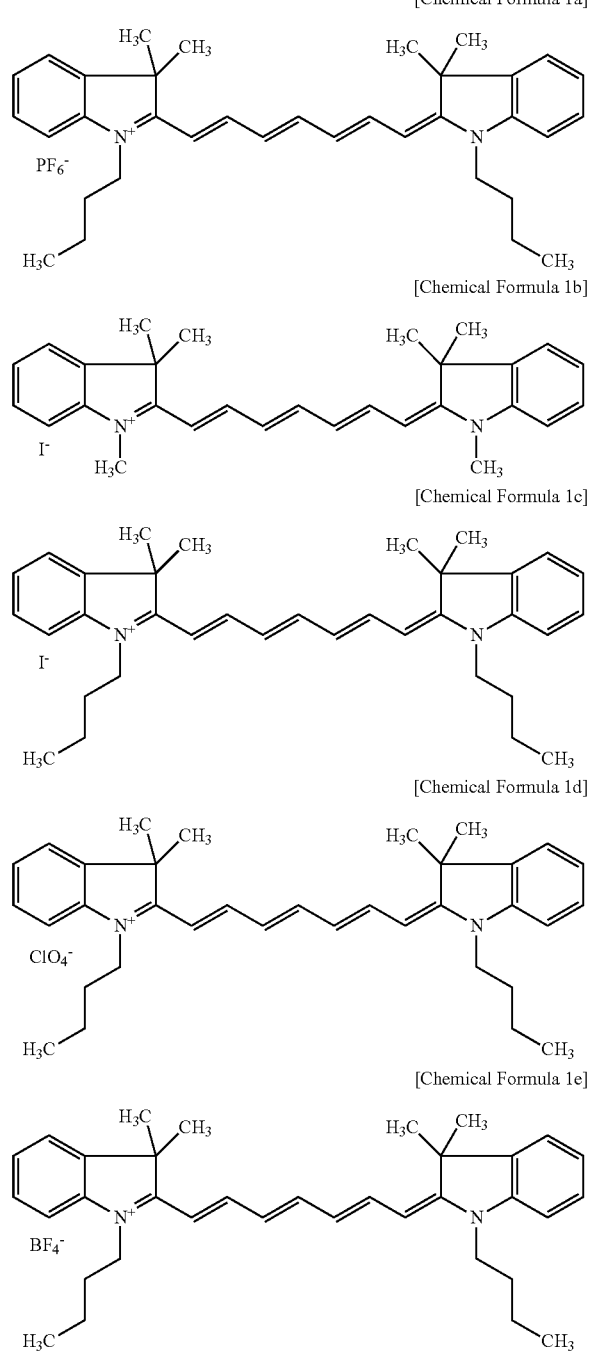

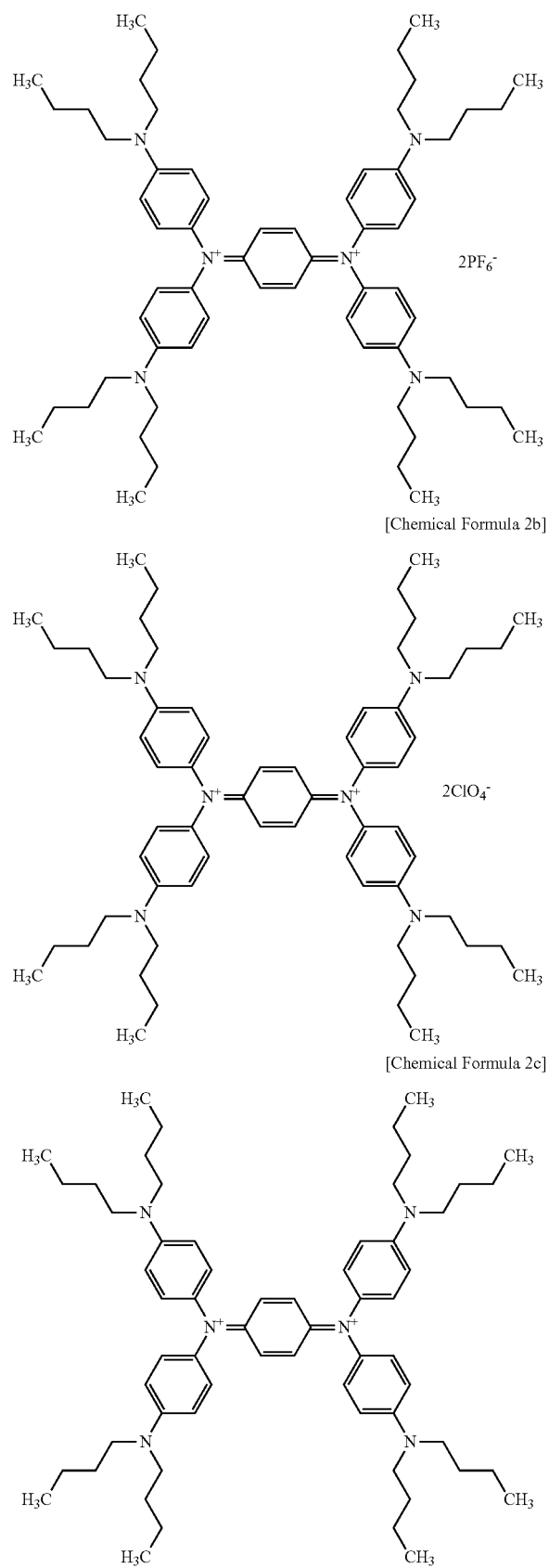

In some example embodiments, the organic dye represented by Chemical Formula 2 may include one or more structures represented by at least one of Chemical Formula 2a, Chemical Formula 2c, or Chemical Formula 2c.

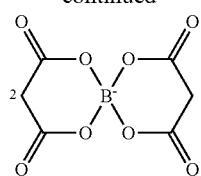

In some example embodiments, the organic dye represented by Chemical Formula 1 may have a maximum absorption wavelength ($\lambda_{max}$) in a wavelength region of about 700 nm to about 760 nm. The organic dye represented by Chemical Formula 2 may have a maximum absorption wavelength ($\lambda_{max}$) in a wavelength region of about 1050 nm to about 1100 nm. The organic dye represented by Chemical Formula 3 may have a maximum absorption wavelength ($\lambda_{max}$) in a wavelength region of about 680 nm to about 720 nm.

In some example embodiments, the binder may include an acrylic binder, an epoxy binder, or a combination thereof.

In some example embodiments, the organic dye represented by Chemical Formula 1 may have an absorbance at a maximum absorption wavelength ($\lambda_{max}$) that is at least about 30 times as high as an absorbance of the organic dye represented by Chemical Formula 1 at a wavelength of about 550 nm. The organic dye represented by Chemical Formula 2 may have an absorbance at a maximum absorption wavelength ($\lambda_{max}$) that is at least about 15 times as high as an absorbance of the organic dye represented by Chemical Formula 2 at a wavelength of about 550 nm.

In some example embodiments, the copper phosphate ester compound may be represented by Chemical Formula 4.

[Chemical Formula 4]

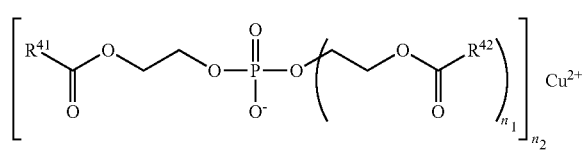

In Chemical Formula 4, R41 and R42 are independently one of a substituted or unsubstituted C1 to C20 alkyl group, a substituted or unsubstituted C2 to C20 alkenyl group, a substituted or unsubstituted C2 to C20 alkynyl group, or a substituted or unsubstituted C6 to C20 aryl group; n1 is an integer of 0 or 1; and n2 is an integer of 1 or 2.

In some example embodiments, the copper phosphate ester compound represented by Chemical Formula 4 may include one or more structures represented by at least one of Chemical Formula 4a, Chemical Formula 4b, Chemical Formula 4c, or Chemical Formula 4d.

[Chemical Formula 4a]

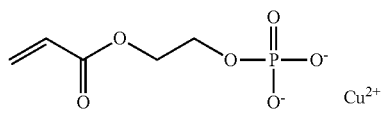

[Chemical Formula 4b]

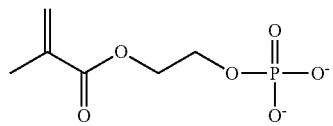

[Chemical Formula 4c]

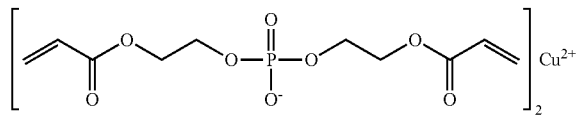

[Chemical Formula 4d]

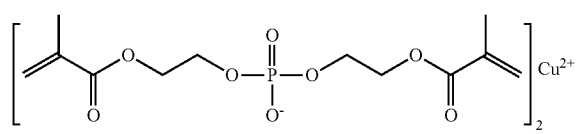

In some example embodiments, the near infrared absorption layer may include a first near infrared absorption layer and a second near infrared absorption layer. The first near infrared absorption layer may consist of the first near infrared absorption material The second near infrared absorption layer may consist of the second near infrared absorption material. The first near infrared absorption layer and the second near infrared absorption layer may be separate layers from each other.

In some example embodiments, the first near infrared absorption layer may be on the polymer film and the second near infrared absorption layer may be on the first near infrared absorption layer.

In some example embodiments, the optical filter may further include an anti-reflection layer on at least one of one surface of the polymer film or one surface of the near infrared absorption layer.

In some example embodiments, the anti-reflection layer may include a first layer and a second layer. A refractive index of the first layer may be different than a refractive index of the second layer. The first layer and the second layer may be alternately stacked two or more.

In some example embodiments, the anti-reflection layer may be on the one surface of the polymer film and the one surface of the near infrared absorption layer, respectively.

In some example embodiments, the polymer film may include one of polyethyleneterephthalate, polyethylenenaphthalate, triacetyl cellulose, polycarbonate, a cycloolefin polymer, poly(meth)acrylate, polyimide, or a combination thereof.

In some example embodiments, a yellow index of the polymer film measured according to ASTM D1925 may be less than or equal to about 10 and a haze of the polymer film may be less than or equal to about 10%.

In some example embodiments, the optical filter may have a thickness of about 25 μm to about 190 μm.

According to some example embodiments, a camera module includes a pair of lens; an image sensor; and the optical filter between the lens and the image sensor.

According to some example embodiments, an electronic device including the optical filter is provided.

According to some example embodiments, an optical filter includes a polymer film having a* of about −5.0 to about +5.0 and b* of about −5.0 to about +5.0 in a color coordinate expressed by a CIE Lab color space; and a near infrared absorption layer on the polymer film. The near infrared absorption layer includes a first near infrared absorption layer and a second near infrared absorption layer. The first near infrared absorption layer includes a copper phosphate ester compound represented by Chemical Formula 4. Chemical Formula 4 may have the same structure as described above. The second near infrared absorption layer may include a plurality of organic dyes having a maximum absorption wavelength ($\lambda_{max}$) in a wavelength region of about 650 nm to about 1200 nm.

In some example embodiments, the copper phosphate ester compound represented by Chemical Formula 4 may include one or more structures represented by at least one of Chemical Formula 4a, Chemical Formula 4b, Chemical Formula 4c, or Chemical Formula 4d. The plurality of organic dyes may include a first organic dye represented by Chemical Formula 1 and at least one of a second organic dye presented by Chemical Formula 2 or a third organic dye represented by Chemical Formula 3. The structures of Chemical Formulas 1, 2, 3, 4a, 4b, 4c, and 4d may be the same as described above.

In some example embodiments, the optical filter may further include at least one of a binder in the second near infrared absorption layer, or an anti-reflection layer on the polymer layer.

In some example embodiments, an electronic device may include a photoelectric device and the optical filter on the photoelectric device.

In some example embodiments, an electronic device may include a substrate, a photo-sensing device integrated with the substrate, and the optical filter on the photo-sensing device.

According to some example embodiments, the optical filter has a high absorption rate about light in a near infrared ray wavelength region and thus may reduce and/or minimize an optical distortion of an image sensor and be made into a thin film.

In addition, the camera module and the electronic device includes the optical filter and may provide an image having a reduced and/or minimized optical distortion and be easily applied to a much down-sized camera module and electronic device.

DETAILED DESCRIPTION

Figure 1:
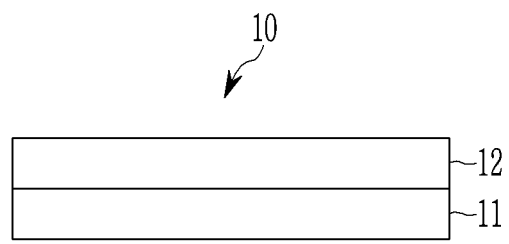
FIG. 1 is a schematic view showing a stack structure of an optical filter according to some example embodiments.

As used herein, when specific definition is not otherwise provided, "alkyl group" refers to a C1 to C20 alkyl group and "aryl group" refers to a C6 to C20 aryl group.

As used herein, when specific definition is not otherwise provided, "substituted" refers to replacement of at least one hydrogen by a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof.

As used herein, when a definition is not otherwise provided, in chemical formula, hydrogen is bonded at the position when a chemical bond is not drawn where supposed to be given.

As used herein, the average light transmittance refers to an average value of light transmittance measured when incident light is radiated in a vertical direction (front direction) of the optical filter. As used herein, "maximum absorption wavelength" refers to a wavelength at which the absorption intensity is the maximum, and it can also be referred to as peak absorption wavelength.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an optical filter according to some example embodiments is described with reference to FIGS. 1 to 13.

FIG. 1 is a schematic view showing a stack structure of an optical filter according to some example embodiments.

Referring to FIG. 1, an optical filter 10 according to some example embodiments includes a polymer film 11 and a near infrared absorption layer 12.

The polymer film 11 may be a transparent polymer film and have for example an average light transmittance of greater than or equal to about 80%, greater than or equal to about 85%, greater than or equal to about 90%, greater than or equal to about 95%, or even very close to 100% in a visible region. Herein, the visible region may be for example a wavelength region of greater than about 380 nm and less than about 700 nm, for example a wavelength region of about 430 nm to about 630 nm, and/or for example a wavelength region of about 430 nm to about 565 nm. The average light transmittance is an average value of light transmittance measured when incident light is radiated in a vertical direction (front direction) of the polymer film 11.

The polymer film 11 may include polyethyleneterephthalate, polyethylenenaphthalate, triacetyl cellulose, polycarbonate, a cycloolefin polymer, poly(meth)acrylate, polyimide, or a combination thereof, but is not limited thereto. The polymer film 11 may include various additives according to desired properties of the optical film 10.

The polymer film 11 may selectively absorb at least one part of light in an ultraviolet (UV) region. Herein, the ultraviolet (UV) region may be, for example a wavelength region of less than or equal to about 380 nm.

The polymer film 11 may absorb most of light in a wavelength region of at least about 350 nm to about 380 nm. For example, an average light transmittance of the optical filter 10 in a wavelength region of about 350 nm to about 380 nm may be less than or equal to about 5%, less than or equal to about 3%, less than or equal to about 1%, less than or equal to about 0.8%, or less than or equal to about 0.5%.

The polymer film 11 may have a thickness of about 25 μm to about 105 μm, but is not limited thereto.

The polymer film 11 may have a* of about −5.0 to about +5.0 and b* of about −5.0 to about +5.0 in a color coordinate expressed by a CIE Lab color space. The polymer film 11 may have a* of about −3.0 to about +3.0, for example about −1.5 to about +1.5 and b* of about −3.0 to about +3.0, for example about −1.5 to about +1.5. On the other hand, a range of L in a color coordinate is not particularly limited.

When the polymer film 11 satisfies the range of a* and/or b* on the color coordinate, a color distortion phenomenon by the optical filter 10 may be limited and/or minimized.

A yellow index (YI) of the polymer film 11 may be for example less than or equal to about 15, less than or equal to about 14, less than or equal to about 13, less than or equal to about 12, less than or equal to about 11, less than or equal to about 10, less than or equal to about 9, less than or equal to about 8, less than or equal to about 7, less than or equal to about 6, or less than or equal to about 5.

A haze of polymer film 11 may be measured according to ASTM D1003. The haze of the polymer film 11 may be for example less than or equal to about 15%, less than or equal to about 14%, less than or equal to about 13%, less than or equal to about 12%, less than or equal to about 11%, less than or equal to about 10%, less than or equal to about 9%, less than or equal to about 8%, less than or equal to about 7%, less than or equal to about 6%, or less than or equal to about 5%.

When the polymer film 11 satisfies the yellow index and/or haze ranges, absorption, scattering, reflection, and the like of light in a visible region by the polymer film 11 may be limited and/or minimized, and accordingly, the optical filter 10 may provide an image with a limited and/or minimal color distortion.

The near infrared absorption layer 12 is configured to transmit light in a visible region and to selectively absorb at least one part of light in a near infrared region. Herein, the visible region may be for example a wavelength region of greater than about 380 nm and less than about 700 nm, for example about 430 nm to about 630 nm, for example about 430 nm to about 565 nm and the near infrared region may be for example a wavelength region of about 700 nm to 1200 nm.

The near infrared absorption layer 12 may include a first near infrared absorption material and a second near infrared absorption material.

The first near infrared absorption material may include a copper phosphate ester compound. The first near infrared absorption material may be obtained by coating and drying a composition comprising a soluble copper phosphate ester compound including acrylate group.

The copper phosphate ester compound may have vast absorption capability about light in a near infrared ray wavelength region and even absorb and/or reflect light in a mid-infrared region and a far-infrared ray wavelength region. The copper phosphate ester compound may for example absorb and/or reflect light in a wavelength region ranging from about 700 nm to about 3 μm.

The copper phosphate ester compound may represented by Chemical Formula 4.

[Chemical Formula 4]

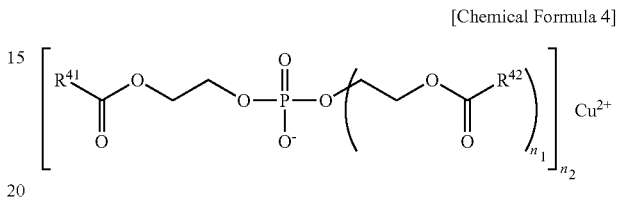

In Chemical Formula 4, $R^{41}$ and $R^{42}$ are independently one of a substituted or unsubstituted C1 to C20 alkyl group, a substituted or unsubstituted C2 to C20 alkenyl group, a substituted or unsubstituted C2 to C20 alkynyl group, and a substituted or unsubstituted C6 to C20 aryl group; $n_1$ is an integer of 0 or 1; and $n_2$ is an integer of 1 or 2.

The copper phosphate ester compound represented by Chemical Formula 4 may include at least one structure represented by Chemical Formula 4a to Chemical Formula 4d.

[Chemical Formula 4a]

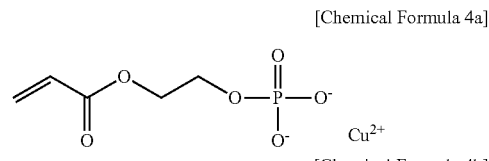

[Chemical Formula 4b]

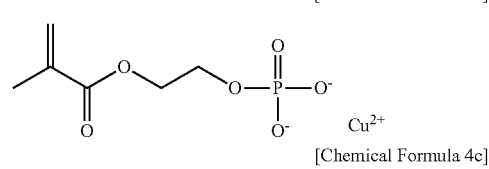

[Chemical Formula 4c]

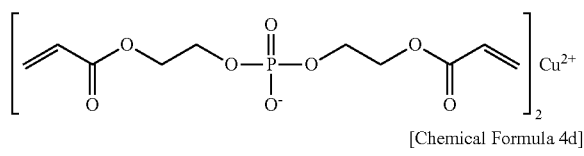

[Chemical Formula 4d]

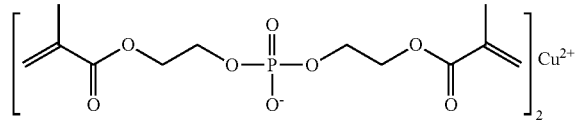

In general, when UV is radiated into an optical filter, the UV may have an influence on the optical filter, a color filter, and the like and thus cause a color distortion phenomenon. Accordingly, the UV may be blocked in a method of forming a UV reflection layer on the optical filter and including a UV absorber (e.g., a copper compound), an organic dye (e.g., a yellow organic dye), and the like in the optical filter.

A copper phosphate salt, one copper compound, has vast absorption capability for light in a near infrared ray wavelength region but very low UV absorption intensity. However, a copper phosphate salt composition needs to be used in an excessive amount to form a near infrared absorption layer. In this way, when the copper phosphate salt composition is used in an excessive amount to prepare a high concentration copper phosphate ester compound solution, the copper phosphate salt composition in an excessive amount increases viscosity of the high concentration copper phosphate ester compound solution and thus hinders the near infrared absorption layer from being formed to be thin. In other words, when the excessive amount-copper phosphate ester compound solution alone is used to form the near infrared absorption layer, the optical filter may not be formed into a thin film.

On the contrary, the near infrared absorption layer 12 of the optical filter 10 according to some example embodiments includes a second near infrared absorption material comprising an organic dye as well as the aforementioned first near infrared absorption material. The second near infrared absorption material may show excellent UV absorption intensity in a relatively small amount relative to that of the copper phosphate ester compound. Accordingly, when the second near infrared absorption material is used along with the first near infrared absorption material, an optical filter having excellent UV absorption intensity and excellent near infrared ray absorption capability in a vast region and simultaneously formed into a thin film may be provided.

The second near infrared absorption material includes an organic dye. The second near infrared absorption material may have a maximum absorption wavelength (λmax) within a wavelength range including a near infrared region and/or a part of a red region near to the near infrared region.

The second near infrared absorption material may have a maximum absorption wavelength (λmax) in a near infrared region including a part of a red region, for example about 650 nm to about 1200 nm, about 660 nm to about 1200 nm, about 670 nm to about 1200 nm, about 680 nm to about 1200 nm, or about 690 nm to about 1200 nm. However, inventive concepts are not limited thereto, the second near infrared absorption material may have a maximum absorption wavelength (λmax) in a near infrared region almost no absorption and or not at all including the red region, for example, in a region ranging from about 700 nm to about 1200 nm, but almost no absorption or not at all in the red region, depending on a kind of the organic dye, a kind of the polymer film 11, and the like.

The second near infrared absorption material includes a binder and an organic dye represented by Chemical Formula 1, and may further include at least one of an organic dye represented by Chemical Formula 2 and an organic dye represented by Chemical Formula 3.

[Chemical Formula 1]

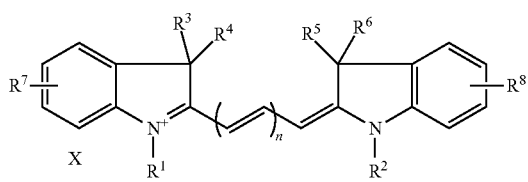

[Chemical Formula 2]

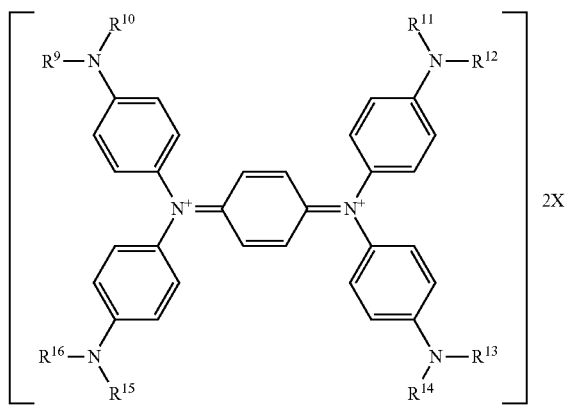

[Chemical Formula 3]

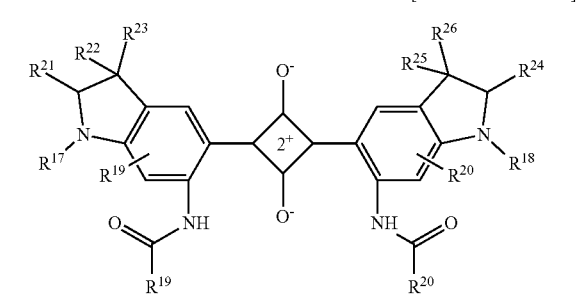

In Chemical Formula 1 to Chemical Formula 3, $R^1$ to $R^{26}$ are independently a hydrogen atom, a substituted or unsubstituted C1 to C20 alkyl group, or a substituted or unsubstituted C6 to C20 aryl group; X is one of $PF_6^-$, $BF_4^-$, $ClO_4^-$, $I^-$, or a borate-based anion, and n is an integer ranging from 1 to 10.

The binder may be, for example an organic binder, an inorganic binder, an organic/inorganic binder, or a combination thereof, and may be mixed with the dyes represented by Chemical Formula 1 to Chemical Formula 3 or may disperse the dyes represented by Chemical Formula 1 to Chemical Formula 3. The binder is not particularly limited as long as it attaches the dyes represented by Chemical Formula 1 to Chemical Formula 3 to the polymer film 11 well.

The binder may include an acrylic binder, an epoxy binder, or a combination thereof. In some example embodiments, the binder may be an acrylic binder. For example, the acrylic binder may be a curable binder, for example a thermally curable binder, a photo-curable binder, or a combination thereof.

The binder may be for example methyl cellulose, ethyl cellulose, hydroxypropyl methyl cellulose (HPMC), hydroxypropyl cellulose (HPC), a xanthan gum, polyvinyl alcohol (PVA), polyvinyl pyrrolidone (PVP), carboxyl methyl cellulose, hydroxyethyl cellulose, or a combination thereof, but is not limited thereto.

The organic dye represented by Chemical Formula 1 may have a maximum absorption wavelength (λmax) in a wavelength region of about 700 nm to about 760 nm, the organic dye represented by Chemical Formula 2 may have a maximum absorption wavelength (λmax) in a wavelength region of about 1050 nm to about 1100 nm, and the organic dye represented by Chemical Formula 3 may have a maximum absorption wavelength (λmax) in a wavelength region ranging from about 680 nm to about 720 nm. When at least two organic dyes having a maximum absorption wavelength (λmax) in a different wavelength region are used, near infrared ray absorption capability about a wide near infrared ray wavelength region may be secured.

The organic dye represented by Chemical Formula 1 may have greater than or equal to about 30 times, for example, greater than or equal to about 40 times, for example, greater than or equal to about 50 times, for example, greater than or equal to about 60 times, for example, greater than or equal to about 70 times, and even greater than or equal to about 80 times higher absorbance at a maximum absorption wavelength ($\lambda_{max}$) than absorbance at a wavelength of about 550 nm.

The organic dye represented by Chemical Formula 2 may have greater than or equal to about 15 times, for example, greater than or equal to about 20 times, for example, greater than or equal to about 25 times, for example, greater than or equal to about 30 times, for example, greater than or equal to about 40 times, and for example, greater than or equal to about 50 times higher absorbance at a maximum absorption wavelength (λmax) than absorbance at a wavelength of about 550 nm.

In this way, since the organic dye represented by Chemical Formula 1 satisfies at least greater than or equal to about 30 times higher absorbance at a maximum absorption wavelength (λmax) than absorbance at a wavelength of about 550 nm, and the organic dye represented by Chemical Formula 2 also satisfies at least greater than or equal to about 15 times higher absorbance at a maximum absorption wavelength (λmax) than absorbance at a wavelength of about 550 nm, the optical filter 10 may show high light transmittance in a visible region and simultaneously, very low light transmittance in a near infrared region.

When the organic dye has less than about 15 times higher absorbance at a maximum absorption wavelength (λmax) than absorbance at a wavelength of about 550 nm, the organic dye deteriorates light transmittance in a visible region and lacks of the above property and thus may not be used for a near infrared absorption layer of the optical filter 10 according to some example embodiments.

In some example embodiments, the second near infrared absorption material includes at least two different kind of organic dyes and particularly, may further include the organic dye represented by Chemical Formula 2 and/or the organic dye represented by Chemical Formula 3 in addition to the organic dye represented by Chemical Formula 1.

When at least two different kind of organic dyes are mixed, the second near infrared absorption material may have near infrared ray absorption capability about light in different wavelength regions simultaneously, and thus the near infrared absorption layer 12 may have the near infrared ray absorption capability in a wider near infrared ray wavelength region.

In other words, when the organic dye represented by Chemical Formula 1 is used alone, light transmittance in a particular wavelength region out of the near infrared region may be set very low, but light transmittance in the other wavelength regions (e.g., 1100 nm to 1200 nm) may not be adjusted. However, when the organic dye represented by Chemical Formula 2 and/or Chemical Formula 3 is further added to the organic dye represented by Chemical Formula 1, these organic dyes may be used in a smaller amount than that of the organic dye represented by Chemical Formula 1 alone but lower light transmittance in a near infrared region to be less than or equal to about 25%, less than or equal to about 20%, less than or equal to about 15%, less than or equal to about 10%, even less than or equal to about 5%, or less than or equal to about 4% compared with the organic dye represented by Chemical Formula 1 without deteriorating light transmittance in a visible region and accordingly, be appropriately used for the near infrared absorption layer 12 of the optical filter 10.

The organic dye represented by Chemical Formula 1 may include at least one selected from Chemical Formula 1a to Chemical Formula 1e.

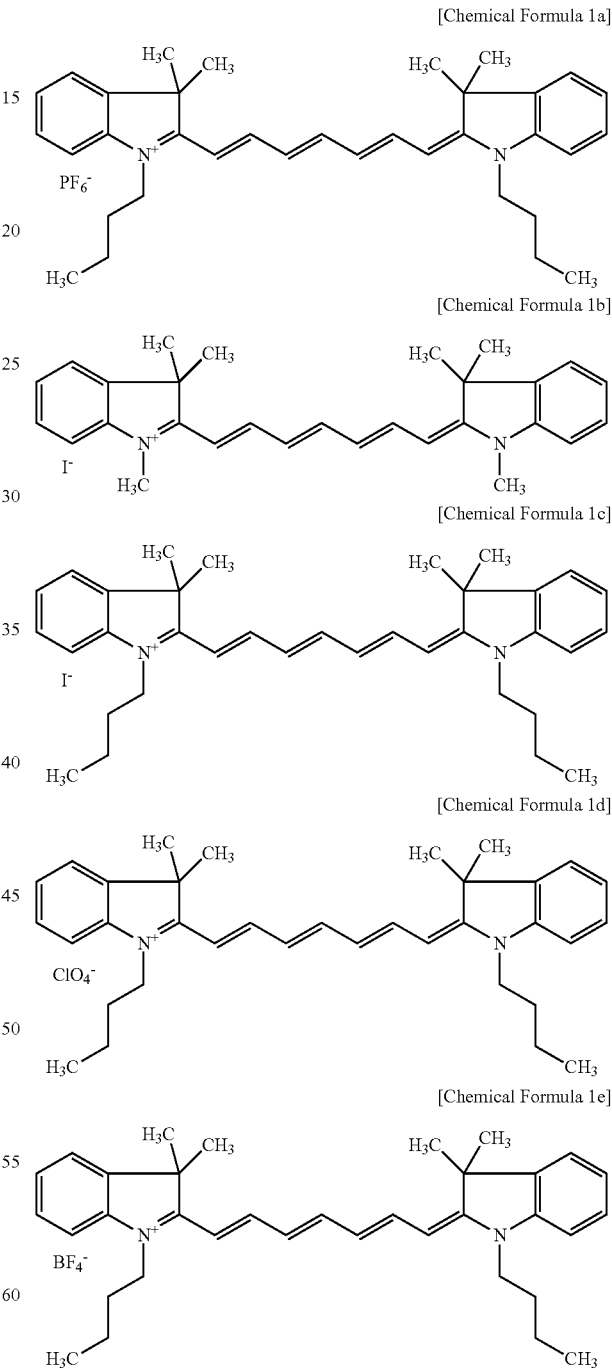

[Chemical Formula 1a]

[Chemical Formula 1b]

[Chemical Formula 1c]

[Chemical Formula 1d]

[Chemical Formula 1e]

The organic dye represented by Chemical Formula 2 may include at least one selected from Chemical Formula 2a to Chemical Formula 2c.

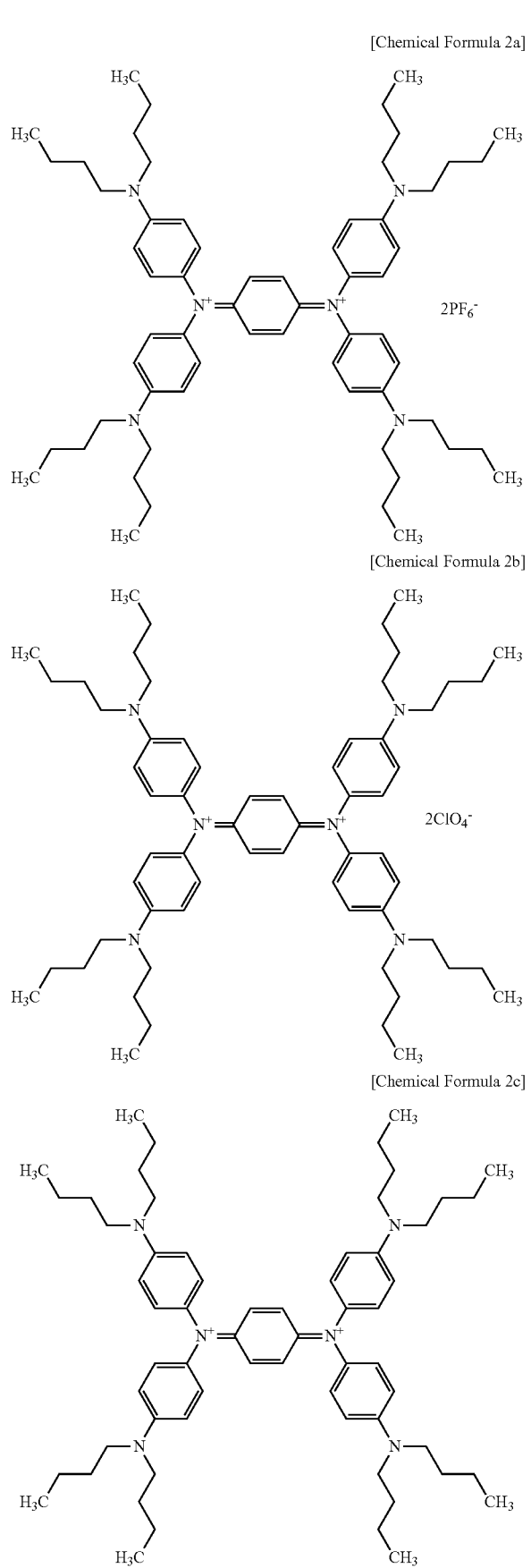

[Chemical Formula 2a]

[Chemical Formula 2b]

[Chemical Formula 2c]

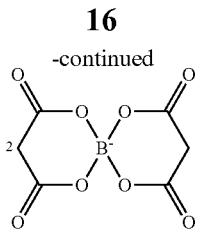

The second near infrared absorption material may further include an organic dye having a different structure from the organic dyes represented by Chemical Formula 1 to Chemical Formula 3.

The organic dye having a different structure from the organic dyes represented by Chemical Formula 1 to Chemical Formula 3 may be for example a polymethine compound, a phthalocyanine compound, a merocyanine compound, naphthalocyanine, an immonium compound, a triarylmethane compound, a dipyrromethene compound, an anthraquinone compound, naphthoquinone, a diquinone compound, a rylene compound, a perylene compound, a squaraine compound, a pyrylium compound, a thiopyrylium compound, a diketopyrrolopyrrole compound, a dithiolene metal complex compound, a derivative thereof, or a combination thereof, but is not limited thereto.

In general, an organic dye has very excellent UV absorption intensity as described above but a relatively narrow UV absorption region compared with copper phosphate salt and thus a limit in absorbing light in a UV region (the organic dye alone is usefully used as a medically labeling material for diagnosing a cancer, a coloring material of clothes, and the like by using its characteristics of revealing a color but having a small UV absorption region).

In addition, the organic dye has excellent near infrared ray absorption intensity but a relatively narrow near infrared ray absorption region compared with copper phosphate salt and thus may not be used when absorption capability about a wide near infrared ray wavelength region is needed.

However, the near infrared absorption layer 12 of the optical filter 10 according to some example embodiments uses the first near infrared absorption material including the copper phosphate ester compound and the second near infrared absorption material together. In addition, the second near infrared absorption material uses at least two different organic dyes, specifically, at least one of the organic dyes represented by Chemical Formulae 2 and 3 and the organic dye represented by Chemical Formula 1 along with a binder.

Accordingly, when the first and second near infrared absorption materials are used together, a problem of the conventional organic dye having a narrow UV and near infrared ray absorption regions may be solved.

On the other hand, the first near infrared absorption material and the second near infrared absorption material are disposed on the polymer film 11 and herein, united and formed as one layer, as shown in FIG. 1. However, inventive concepts are not necessarily limited thereto, but the first and second near infrared absorption materials may respectively form each own layer with a consideration to compatibility and the like between the first and second near infrared absorption materials and be all disposed on both sides of the polymer film 11.

Figure 2:
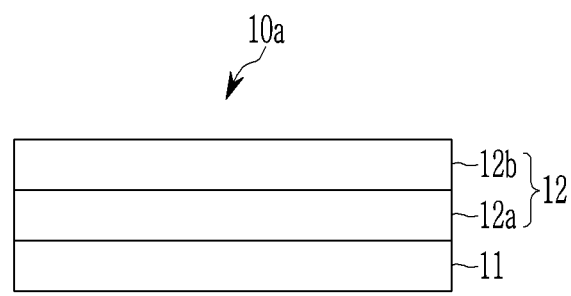
FIGS. 2 to 5 show various examples of disposition relationships of the near infrared absorption layer in the optical filter of FIG. 1.
Figure 3:
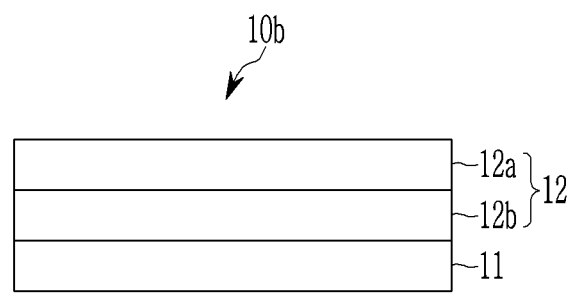
Figure 4:
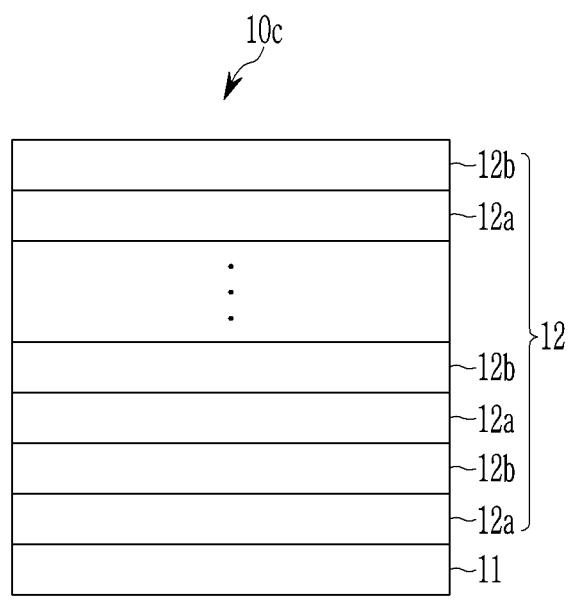

FIGS. 2 to 4 show various examples that the near infrared absorption layer in the optical filter of FIG. 1 includes the first and second near infrared absorption layers.

The near infrared absorption layer 12 may include a first near infrared absorption layer 12a formed of a first near infrared absorption material and a second near infrared absorption layer 12b formed of a second near infrared absorption material. The first and second near infrared absorption layers 12a and 12b are respectively formed as separate layers.

Referring to FIG. 2, the optical filter 10a may have a disposition structure that the first and second near infrared absorption layers 12a and 12b are disposed in order on the polymer film 11.

However, as shown in FIG. 3, the optical filter 10b may have a disposition structure that the second near infrared absorption layer 12b and the first near infrared absorption layer 12a are disposed in order on the polymer film 11.

In addition, as shown in an optical filter 10c according to FIG. 4, the first and second near infrared absorption layers 12a and 12b are at least twice alternately disposed on the polymer film 11. On the other hand, FIG. 4 shows that the near infrared absorption layer 12 is disposed by disposing the first and second near infrared absorption layers 12a and 12b in order on the polymer film 11, but the second and first near infrared absorption layers 12b and 12a may be disposed in order.

Figure 5:
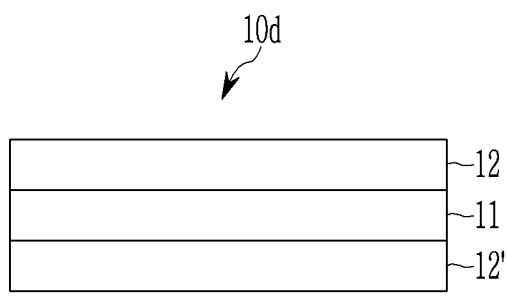

FIG. 5 shows a structure that a near infrared absorption layer is respectively formed on both sides of a polymer film in the optical filter of FIG. 1.

An optical filter 10d according to FIG. 5 has a structure that a pair of near infrared absorption layers 12 and 12' is respectively disposed on both sides of the polymer film 11. The pair of near infrared absorption layers 12 and 12' may be formed as one layer wherein the first and second near infrared absorption materials are united as one body as shown in FIG. 5, but at least one of the pair of near infrared absorption layers 12 and 12' may include the first and second near infrared absorption layers 12a and 12b as shown in FIGS. 2 to 4.

As shown above, even though the layer number of the near infrared absorption layer 12 and its disposition relationship with the polymer film 11 are variously changed, all the optical filters 10, 10a, 10b, 10c, and 10d according to some example embodiments may limit and/or minimize an optical distortion phenomenon of an image sensor. Accordingly, the optical filters 10, 10a, 10b, 10c, and 10d may be variously disposed considering their relationship with a camera module and other constituent elements in an electronic device as described above.

The optical filter 10 may further include an anti-reflection layer on one surface of the polymer film 11 and/or on at least one surface of the near infrared absorption layer 12.

Figure 6:
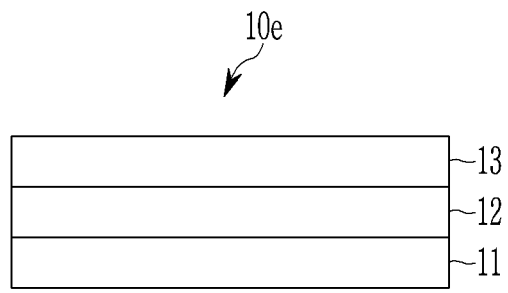
FIG. 6 is a schematic view showing a stack structure of an optical filter including an anti-reflection layer according to some example embodiments.

FIG. 6 is a schematic view showing a stack structure of an optical filter including an anti-reflection layer according to some example embodiments.

Referring to FIG. 6, an optical filter 10f further includes an anti-reflection layer 13 on the upper surface of the near infrared absorption layer 12.

The anti-reflection layer 13 may play a role of limiting and/or preventing reflection of an incident visible ray through the optical filter 10f and improving visible light transmittance of the optical filter 10 and in addition, lowering visible ray reflectance and thus effectively reducing or preventing an optical distortion by reflected light.

Among conventional optical filters, a method of disposing both the near infrared absorption layer and the near infrared ray reflection layer is used in order to block a near infrared ray. However, this optical filter may excellently block a near infrared ray itself but rarely secure visible ray transmittance.

However, the optical filter 10f according to some example embodiments may absorb light in a near infrared ray wavelength region by using the near infrared absorption layer 12 and simultaneously, include the anti-reflection layer 13 instead of a near infrared ray reflection layer and thus have improved visible ray transmittance. Accordingly, the optical filter 10f according to some example embodiments has excellent near infrared ray absorption capability and visible ray transmittance simultaneously.

The anti-reflection layer 13 may be any layer capable of limiting and/or preventing reflection of light in a visible ray wavelength region but transmitting a visible ray toward the polymer film 11 without a particular limit, for example, a multilayer including a high refractive index anti-reflection layer, an anti-reflection layer including a high refractive index nano particle, or a plurality of layer having a different refractive indexes but is not limited thereto.

Figure 7:
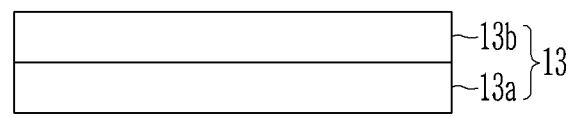
FIGS. 7 and 8 are schematic views showing various stack structures of the anti-reflection layer.
Figure 8:
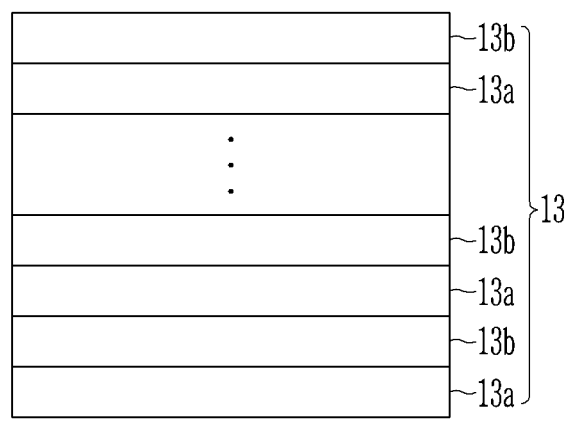

FIGS. 7 and 8 are schematic views showing various stack structures of the anti-reflection layer.

Referring to FIG. 7, the anti-reflection layer 13 may include a first layer 13a and a second layer 13b respectively formed of each material having a different refractive index, and referring to FIG. 8, the first and second layers 13a and 13b are alternately at least twice stacked.

The first and second layers 13a and 13b may be for example a dielectric layer respectively including an oxide layer, a nitride layer, an oxynitride layer, a sulfide layer, or a combination thereof, for example, when the second layer 13b meets incident light first, the second layer 13b has a lower refractive index than that of the first layer 13a. For example, the second layer 13b may have a refractive index of less than about 1.7, and the first layer 13a may have a refractive index of greater than or equal to about 1.7.

Within the range, the second layer 13b may for example have a refractive index ranging from greater than or equal to about 1.1 and less than about 1.7, the first layer 13a may have a refractive index ranging from about 1.7 to about 2.7, within the range, the second layer 13b may for example have a refractive index ranging from about 1.2 to about 1.6, and the first layer 13a may have a refractive index ranging from about 1.8 to about 2.5.

The first and second layers 13a and 13b may be formed of any material having the refractive indexes without a particular limit, for example, the first layer 13a may be formed of titanium oxide, zinc oxide, indium oxide, zirconium oxide, or a combination thereof, and the second layer 13b may be formed of silicon oxide, aluminum oxide, or a combination thereof. The first and second layers 13a and 13b may be for example about 5 to about 80 layers, and within the range, for example, about 5 to about 50 layers.

The first and second layers 13a and 13b may have a thickness determined depending on a refractive index and a reflection wavelength of each layer, and herein, the first layer 13a may have for example a thickness of about 30 nm to about 600 nm, and the second layer 13b may have a thickness ranging from about 10 nm to about 700 nm. The first and second layers 13a and 13b may have the same or different thickness.

The anti-reflection layer 13 may for example have a thickness ranging from about 1 μm to about 20 μm.

FIGS. 9 to 13 show various examples of disposition relationships of an anti-reflection layer in an optical filter according to some example embodiments.

Figure 9:
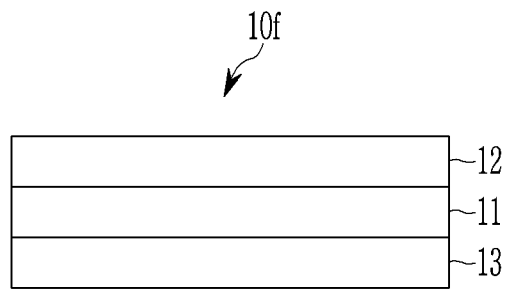
FIGS. 9 to 13 show various examples of disposition relationships of an anti-reflection layer in an optical filter according to some example embodiments.

Referring to FIG. 9, the optical filter 10f has the anti-reflection layer 13 beneath the polymer film 11 unlike the one of FIG. 6. However, inventive concepts are not limited thereto and the anti-reflection layer 13 may be variously disposed with a consideration to its relationship with other constituent elements in an electronic device.

Figure 10:
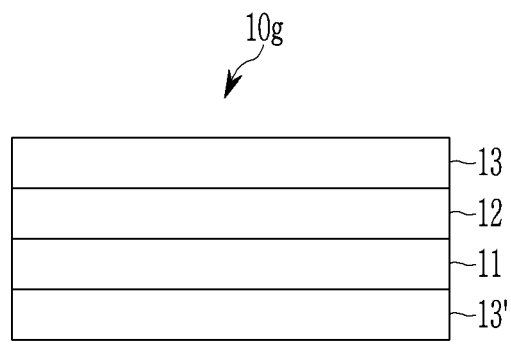
Figure 11:
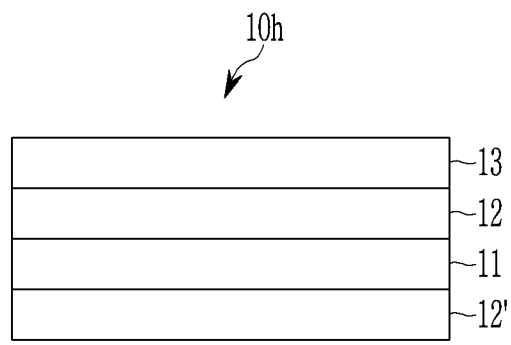
Figure 12:
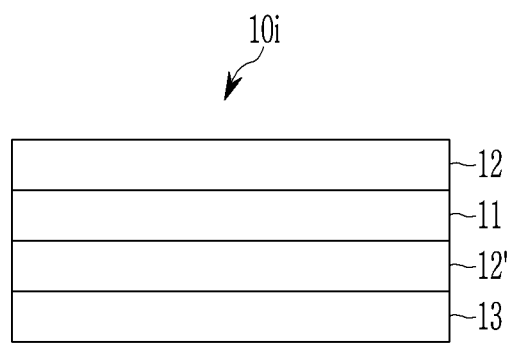
Figure 13:
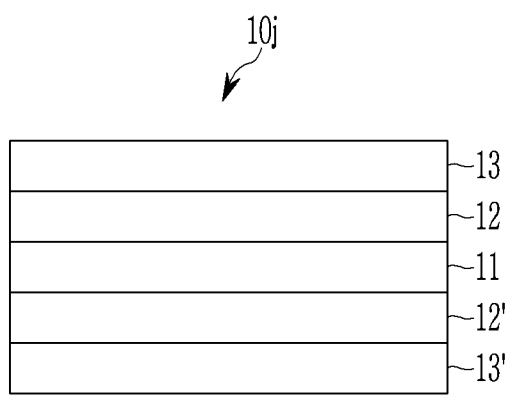

For example, an optical filter 10g has a pair of anti-reflection layers 13 and 13' respectively disposed on the near infrared absorption layer 12 and beneath the polymer film 11 as shown in FIG. 10. On the other hand, when an optical filter includes a pair of near infrared absorption layers 12 and 12' as shown in FIG. 5, the anti-reflection layer 13 may be respectively disposed on either one of the pair of near infrared absorption layers 12 and 12' (the optical filter 10h of FIG. 11 and the optical filter 10i of FIG. 12) or both of them (the optical filter 10j of FIG. 13).

In this way, the optical filters 10e, 10f, 10g, 10h, 10i, and 10j according to some example embodiments may limit and/or minimize an optical distortion phenomenon of an image sensor, even though the anti-reflection layer 13 has various dispose structures, and accordingly, the anti-reflection layer 13 may be variously disposed with a consideration to its relationship with a camera module and other constituent elements in an electronic device.

For example, the optical filter 10 may have an average light transmittance of less than or equal to about 25%, less than or equal to about 20%, less than or equal to about 15%, less than or equal to about 10%, less than or equal to about 5%, or less than or equal to about 4% in a wavelength region of about 700 nm to about 1200 nm.

Particularly, the optical filter 10 may have an average light transmittance of less than or equal to about 5% or less than or equal to about 4% in a wavelength region of about 700 nm to about 740 nm and may have an average light transmittance of less than or equal to about 25%, less than or equal to about 20%, less than or equal to about 15%, less than or equal to about 14%, less than or equal to about 13%, less than or equal to about 12%, less than or equal to about 11%, or less than or equal to about 10% in a wavelength region of about 1000 nm to about 1200 nm.

In addition, the optical filter 10 may have an average light transmittance of greater than or equal to about 80%, for example greater than or equal to about 81%, greater than or equal to about 82%, greater than or equal to about 83%, greater than or equal to about 84%, greater than or equal to about 85%, greater than or equal to about 86%, greater than or equal to about 87%, or greater than or equal to about 88% in a wavelength region of about 430 nm to about 565 nm.

In other words, the optical filter 10 uses the first and second near infrared absorption materials having different near infrared ray absorption intensity and absorption wavelength ranges and thus shows excellent near infrared ray absorption capability and visible ray light transmittance.

On the other hand, the optical filter 10 may be easily formed as a thin film having a thickness ranging from hundreds of micrometer to tens of micrometer without a particular limit. A thickness of the optical filter 10 may be for example greater than or equal to about 20 μm, greater than or equal to about 25 μm, greater than or equal to about 30 μm, greater than or equal to about 45 μm, greater than or equal to about 50 μm, greater than or equal to about 55 μm, greater than or equal to about 60 μm, greater than or equal to about 65 μm, greater than or equal to about 70 μm and may be for example less than or equal to about 210 μm, less than or equal to about 200 μm, less than or equal to about 190 μm, less than or equal to about 180 μm, less than or equal to about 170 μm, less than or equal to about 160 μm, less than or equal to about 150 μm, or less than or equal to about 140 μm, or may be for example about 50 μm to about 150 μm.

An optical filter for near infrared ray absorption may have a thickness ranging from about 210 μm to about 250 μm when a glass substrate is used but no more be thinner due to a limit of the material. In addition, when the glass substrate is simply replaced with a plastic substrate in order to solve this problem, an optical distortion phenomenon of an image sensor may be accentuated by the aforementioned flare phenomenon.

However, the optical filter 10 according to some example embodiments may be formed into a thin film having a thickness within the above range and simultaneously, have excellent visible ray light transmittance and near infrared ray absorption capability as described above. Accordingly, the optical filter 10 may minimize an optical distortion phenomenon of an electronic device such as an image sensor and the like and contribute to down-sizing the electronic device.

Figure 14:
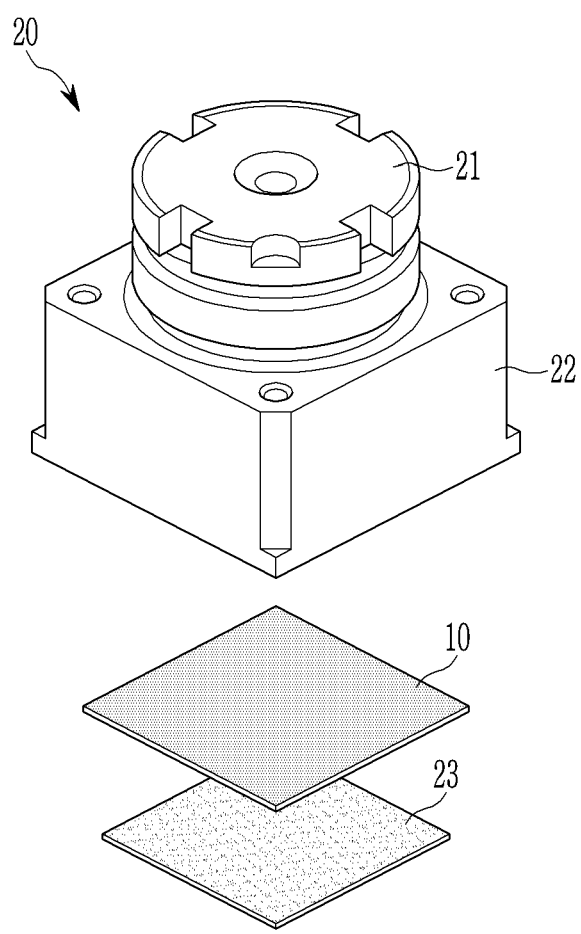
FIG. 14 is a schematic view showing a camera module according to some example embodiments.

FIG. 14 is a schematic view showing a camera module according to some example embodiments.

Referring to FIG. 14, a camera module 20 includes a lens barrel 21, a housing 22, an optical filter 10, and an image sensor 23.

The lens barrel 21 includes at least one lens imaging a subject, and the lens may be disposed along an optical axis direction. Herein, the optical axis direction may be a vertical direction of the lens barrel 21.

The lens barrel 21 is internally housed in the housing 22 and united with the housing 22. The lens barrel 21 may be moved in optical axis direction inside the housing 22 for autofocusing.

The housing 22 supports and houses the lens barrel 21 and may be open in the optical axis direction. Accordingly, incident light from one surface of the housing 22 may reach the image sensor 21 through the lens barrel 21 and the optical filter 10.

The housing 22 may be equipped with an actuator for moving the lens barrel 21 in the optical axis direction. The actuator may include a voice coil motor (VCM) including a magnet and a coil. However, various methods such as a mechanical driving system or a piezoelectric driving system using a piezoelectric device other than the actuator may be adopted.

The optical filter 10 is the same as described above and/or may be substituted with any one of the optical filters 10a, 10b, 10c, 10d, 10e, 10f, 10g, 10h, and/or 10i described above.

The image sensor 23 may concentrate an image of a subject and thus store it as data, and the stored data may be displayed as an image through a display media.

The image sensor 23 may be mounted in a substrate (not shown) and electrically connected with the substrate. The substrate may be, for example, a printed circuit board (PCB) or electrically connected to a printed circuit board, and the printed circuit may be, for example, flexible printed circuit (FPCB).

The image sensor 23 concentrates light passing the lens barrel 21 and the optical filter 10 and generates a video signal and may be a complementary metal-oxide semiconductor (CMOS) image sensor and/or a charge coupled device (CCD) image sensor.

Figure 15:
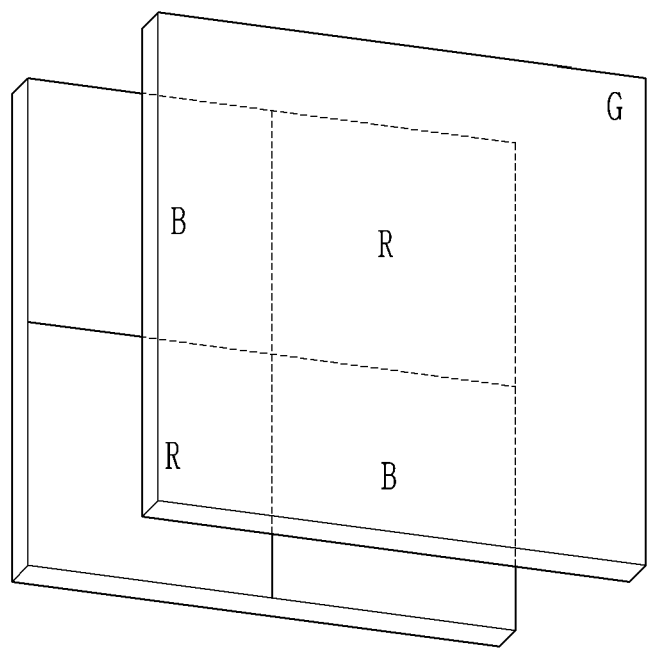
FIG. 15 is a top plan view showing an organic CMOS image sensor as an example of an image sensor.
Figure 16:
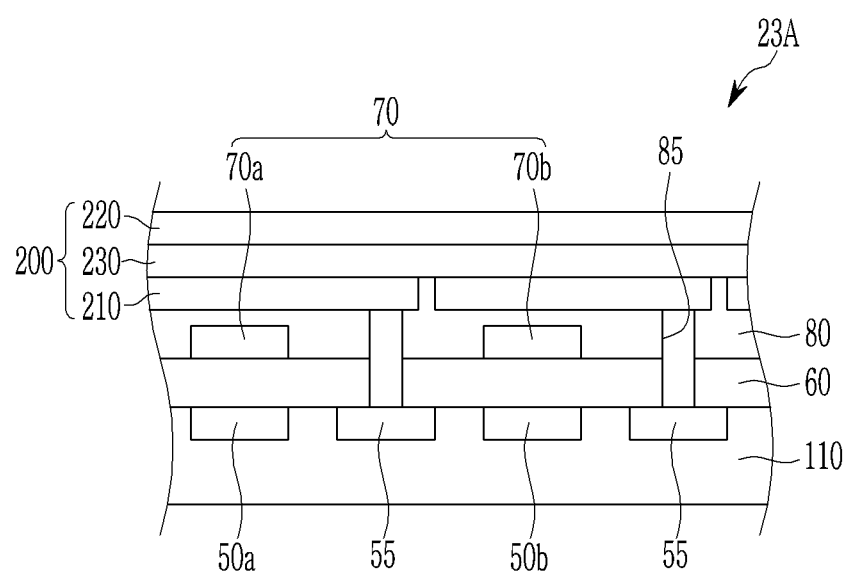
FIG. 16 is a cross-sectional view showing an example of the organic CMOS image sensor of FIG. 15.

FIG. 15 is a top plan view showing an organic CMOS image sensor as an example of an image sensor and FIG. 16 is a cross-sectional view showing an example of the organic CMOS image sensor of FIG. 15.

Referring to FIGS. 15 and 16, an organic CMOS image sensor 23A according to some example embodiments includes a semiconductor substrate 110 integrated with photo-sensing devices 50a and 50b, a transmission transistor (not shown), and a charge storage 55, a lower insulation layer 60, a color filter layer 70, a upper insulation layer 80, and an organic photoelectric device 200.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes.

The photo-sensing devices 50a and 50b, the transmission transistor, and/or the charge storage 55 may be integrated in each pixel, and for example as illustrated in FIG. 16, the photo-sensing devices 50a and 50b may be included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the organic photoelectric device 100, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but is not limited thereto. However, it is not limited to the structure, and the metal wire and pad may be disposed under the photo-sensing devices 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 55. The trench may be filled with fillers.

A color filter layer 70 is formed on the lower insulation layer 60. The color filter layer 70 includes a blue filter 70a formed in the blue pixel and a red filter 70b formed in the red pixel. In FIG. 16, a green filter is not included, but a green filter may be further included.

The upper insulation layer 80 is formed on the color filter layer 70. The upper insulation layer 80 eliminates a step caused by the color filter layer 70 and smoothes the surface. The upper insulation layer 80 and lower insulation layer 60 may include a contact hole (not shown) exposing a pad, and a through-hole 85 exposing the charge storage 55 of a green pixel.

The organic photoelectric device 200 is formed on the upper insulation layer 80. The organic photoelectric device 200 includes a lower electrode 210 and an upper electrode 220 facing each other and a light-absorbing layer 230 disposed between the lower electrode 210 and the upper electrode 220.

The lower electrode 210 and the upper electrode 220 may be all light-transmitting electrodes and the light-absorbing layer 230 may selectively absorb light in a green wavelength region and may replace a color filter of a green pixel.

As described above, the semiconductor substrate 110 and the organic photoelectric device 200 selectively absorbing light in a green wavelength region have a stack structure and thereby the size of an image sensor may be reduced to realize a down-sized image sensor.

Focusing lens (not shown) may be further formed on the organic photoelectric device 200. The focusing lens may control a direction of incident light and gather the light in one region. The focusing lens may have a shape of, for example, a cylinder or a hemisphere, but is not limited thereto.

In FIGS. 15 and 16, a structure where the organic photoelectric device selectively absorbing light in a green wavelength region is stacked on the semiconductor substrate 110 is illustrated, but the present disclosure is not limited thereto. An organic photoelectric device selectively absorbing light in a blue wavelength region may be stacked on the semiconductor substrate 110 and a green photo-sensing device and a red photo-sensing device may be integrated in the semiconductor substrate 110 or an organic photoelectric device selectively absorbing light in a red wavelength region may be stacked on the semiconductor substrate 110 and a green photo-sensing device and a blue photo-sensing device may be integrated in the semiconductor substrate 110.

Among the light in a visible region passing the lens barrel 21 and the optical filter 10, light in a green wavelength region may be mainly absorbed in the light-absorbing layer 30 and photoelectrically converted, and light in a blue wavelength region and a red wavelength region may pass the lower electrode 210 and be sensed by the photo-sensing devices 50a and 50b.

As described above, the optical filters 10 and 10a to 10i may effectively transmit light in a visible region but absorb and block light in a near infrared region and thus transfer pure light in a visible region to an image sensor and resultantly, reduce or prevent a crosstalk generated when a signal by light in a visible region and a signal by light in a non-visible region are crossed and mixed in.

In addition, since the near infrared absorption layer is easily made into a thin film, the optical filter 10 and 10a to 10i may be easily applied to an electronic device such as the camera module 20, the organic photoelectric device 200, and the like, which is down-sized.

Hereinafter, the embodiments are illustrated in more detail with reference to examples. However, these examples are non-limiting, and the present scope is not limited thereto.
Optical Characteristic Comparison of Polymer Films Polymer films 1 to 5 having a thickness of about 40 μm are respectively prepared. A composition, a color coordinate (a*, b*) expressed as a CIE Lab color space, haze, a yellow index, and average light transmittance in a wavelength region of about 430 nm to about 565 nm about the polymer films 1 to 5 are measured, and the results are shown in Table 1.

Optical characteristics except for the composition are measured by using a spectrophotometer (CM3600d. Minolta Co., Ltd.).

TABLE 1

| | Composition | a* | b* | Haze [%] | Yellow index | Average light transmittance [%] in a wavelength region of about 430 nm to about 565 nm |
|---|---|---|---|---|---|---|
| Polymer film 1 | TAC | −0.1 | 0.4 | 0.2 | 2.0 | 92.0 |
| Polymer film 2 | COP | −0.1 | 0.2 | 0.2 | 1.7 | 91.0 |
| Polymer film 3 | PET | −0.1 | 0.8 | 1.2 | 3.0 | 87.8 |
| Polymer film 4 | PC | −0.1 | 0.5 | 0.4 | 2.3 | 88.4 |
| Polymer film 5 | PI | −0.98 | 2.3 | 0.9 | 2.8 | 85.0 |

Referring to Table 1, the polymer films 1 to 5 all satisfy the above color coordinate, haze, yellow index, and average light transmittance in a wavelength region of about 430 nm to about 565 nm within predetermined ranges. Accordingly, the polymer films 1 to 5 all may be used as the polymer film 11 of the optical filter 10 according to some example embodiments.

Coating Property Comparison of Copper Compound for First Near Infrared Absorption Layer Each copper compound composition 1 to 12 is prepared by mixing a copper compound and a solvent. Subsequently, each copper compound composition 1 to 12 is respectively tried to use to form a first near infrared absorption layer, and then, each composition of the copper compound, a dissolution degree of the copper compound, and its precipitation or not after the coating are shown in Table 2.

TABLE 2

| | Composition | Solvent | Solubility | Precipitation after coating |
|---|---|---|---|---|
| Copper compound composition 1 | Chemical Formula 4a | tetrahydrofuran | ⊚ | precipitation X |
| Copper compound composition 2 | Chemical Formula 4a | acetone | ⊚ | precipitation X |
| Copper compound composition 3 | Chemical Formula 4a | methylisobutyl ketone | ⊚ | precipitation X |
| Copper compound composition 4 | copper compound a | tetrahydrofuran | ⊚ | precipitation ○ |
| Copper compound composition 5 | copper compound a | acetone | X | precipitation ○ |
| Copper compound composition 6 | copper compound a | methylisobutyl ketone | X | precipitation ○ |
| Copper compound composition 7 | copper compound b | tetrahydrofuran | X | coating X |
| Copper compound composition 8 | copper compound b | acetone | X | coating X |
| Copper compound composition 9 | copper compound b | methylisobutyl ketone | X | coating X |
| Copper compound composition 10 | copper compound c | tetrahydrofuran | X | coating X |
| Copper compound composition 11 | copper compound c | acetone | X | coating X |
| Copper compound composition 12 | copper compound c | methylisobutyl ketone | X | coating X |

In Table 2, the copper compounds a to c are respectively as follows.

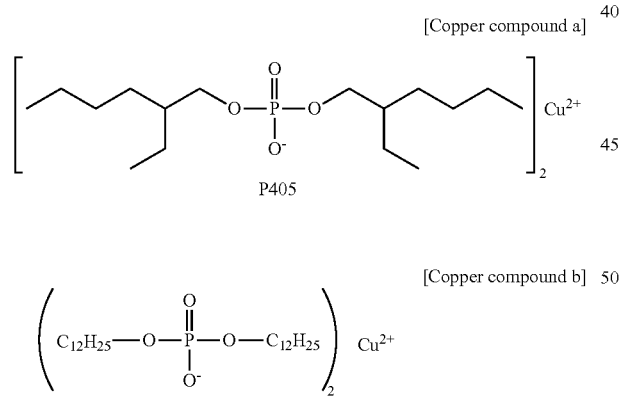

[Copper compound a] P405

[Copper compound b]

[Copper compound c]
Copper (II) Sulfate

Referring to Table 2, a copper phosphate ester compound represented by Chemical Formula 4a as a copper compound shows excellent solubility about all three kinds of solvents (tetrahydrofuran, acetone, or methylisobutylketone) and is not precipitated after the coating and thus secures excellent stability of a coating layer.

The copper compound a as a copper compound shows insufficient solubility about the other solvents except for tetrahydrofuran and is precipitated after the coating and thus shows instability of a coating layer.

On the other hand, both the copper compounds b and c shows insufficient solubility about three kinds of solvents and thus may not form a coating layer.

Accordingly, referring to Table 2, the copper phosphate ester compound represented by Chemical Formula 4a turns out to be an appropriate copper compound for a composition for a first near infrared absorption layer.

Optical Characteristic Comparison of Organic Dyes for Forming Second Near Infrared Absorption Layer Solutions are prepared by respectively dissolving organic dyes 1-6, in chloroform $0.5 \times 10^{-3}$ wt % are prepared. Subsequently, a composition, a maximum absorption wavelength ($\lambda_{max}$), average light transmittance at a maximum absorption wavelength ($\lambda_{max}$), average light transmittance at a wavelength of 550 nm, and a ratio ($abs_{\lambda max}/abs_{550nm}$) of absorbance at a maximum absorption wavelength relative to absorbance at a wavelength of 550 nm about the organic dyes 1 to 6 in each of the prepared solutions are respectively shown in Table 3.

Optical characteristics except for the composition are measured by using a UV-Vis spectrophotometer (SoldiSpec-3700, Shimadzu Corp.).

TABLE 3

| | Composition | $\lambda_{max}$ [nm] | Average light transmittance @$\lambda_{max}$ [%] | Average light transmittance @550 nm [%] | $abs_{\lambda max}/abs_{550\,nm}$ |
|---|---|---|---|---|---|
| Organic dye 1 | Chemical Formula 1a | 747 | 96.2 | 4.1 | 82:1 |
| Organic dye 2 | Chemical Formula 1b | 760 | 95.7 | 12.9 | 47:1 |
| Organic dye 3 | Chemical Formula 1c | 725 | 96.8 | 10.6 | 64:1 |
| Organic dye 4 | Chemical Formula 2a | 1075 | 98.1 | 32.5 | 57:1 |

TABLE 3-continued

|  | Composition | $\lambda_{max}$ [nm] | Average light transmittance @$\lambda_{max}$ [%] | Average light transmittance @550 nm [%] | abs$_{\lambda max}$/abs$_{550\ nm}$ |
|---|---|---|---|---|---|
| Organic dye 5 | Chemical Formula 2b | 1070 | 97.1 | 57.9 | 19:1 |
| Organic dye 6 | Chemical Formula 2c | 1084 | 98.9 | 62.7 | 44:1 |

Referring to Table 3 regarding the organic dyes 1 to 3 belonging to Chemical Formula 1, the organic dye 1 having an anion of $PF_6^-$ shows very excellent abs$_{\lambda max}$/abs$_{660nm}$ compared with those of the organic dyes 2 and 3 having an anion of $I^-$, but when the same anion (L) is used, the organic dye 3 in which $R^1$ and $R^2$ in Chemical Formula 1 are alkyl groups having more carbons shows excellent abs$\lambda$max /abs550 nm compared with the organic dye 2 in which $R^1$ and $R^2$ in Chemical Formula 1 are alkyl groups having less carbons.

On the other hand, regarding the organic dyes 4 to 6 belonging to Chemical Formula 2, the organic dye 4 having an anion of $PF_6^-$ and the organic dye 6 having a borate-based ion as an anion show very excellent abs$_{\lambda max}$/abs$_{550nm}$ compared with the organic dye 5 having an anion of $ClO_4^-$.

Manufacture of Optical Filter

Example 1

A first near infrared absorption layer is formed by coating a copper phosphate salt composition prepared by mixing a THF solvent and copper phosphate ester represented by Chemical Formula 4a on a polymer film, a TAC film (Fuji Tekko Co., Ltd.) and drying it.

Subsequently, on the first near infrared absorption layer, a second near infrared absorption layer is formed by coating a composition for a second near infrared absorption layer which is prepared by mixing an organic dye represented by Chemical Formula 1a, an organic dye represented by Chemical Formula 2a, an acryl-based binder, and methylethylketone as an organic solvent and then, drying it.

On the second near infrared absorption layer, an anti-reflection coating layer (ARC-100, Don Co., Ltd.) is formed to manufacture an optical filter according to Example 1 (polymer film/first near infrared absorption layer/second near infrared absorption layer/anti-reflection layer). The optical filter has a thickness of about 120 μm.

Example 2

An optical filter according to Example 2 (anti-reflection layer/polymer film/first near infrared absorption layer/second near infrared absorption layer/anti-reflection layer) is manufactured according to the same method as Example 1 except for using a polymer film having an anti-reflection layer on the lower surface (DSG-17 TG60, Dai Nippon Printing Co., Ltd.). The optical filter has a thickness of about 117 μm.

Example 3

An optical filter according to Example 3 (anti-reflection layer/polymer film/first near infrared absorption layer/second near infrared absorption layer/anti-reflection layer) is manufactured according to the same method as Example 1 except for using a polymer film having an anti-reflection layer on the lower surface (DSG-17 TG60, Dai Nippon Printing Co., Ltd.) and further including an organic dye represented by Chemical Formula 3 in the composition for a second near infrared absorption layer. The optical filter has a thickness of about 117 μm.

Example 4

An optical filter according to Example 4 (polymer film/ first near infrared absorption layer/second near infrared absorption layer) is manufactured according to the same method as Example 1 except for omitting the anti-reflection layer. The optical filter has a thickness of about 115 μm.

Comparative Example 1

An optical filter according to Comparative Example 1 (polymer film/first near infrared absorption layer) is manufactured according to the same method as Example 1 except for omitting the second near infrared absorption layer and the anti-reflection layer. The optical filter has a thickness of about 110 μm.

Comparative Example 2

An optical filter according to Comparative Example 2 (polymer film/second near infrared absorption layer) is manufactured according to the same method as Example 1 except for forming the second near infrared absorption layer on the polymer film without forming the first near infrared absorption layer and omitting the anti-reflection layer. The optical filter has about thickness of 110 μm.

Figure 17:
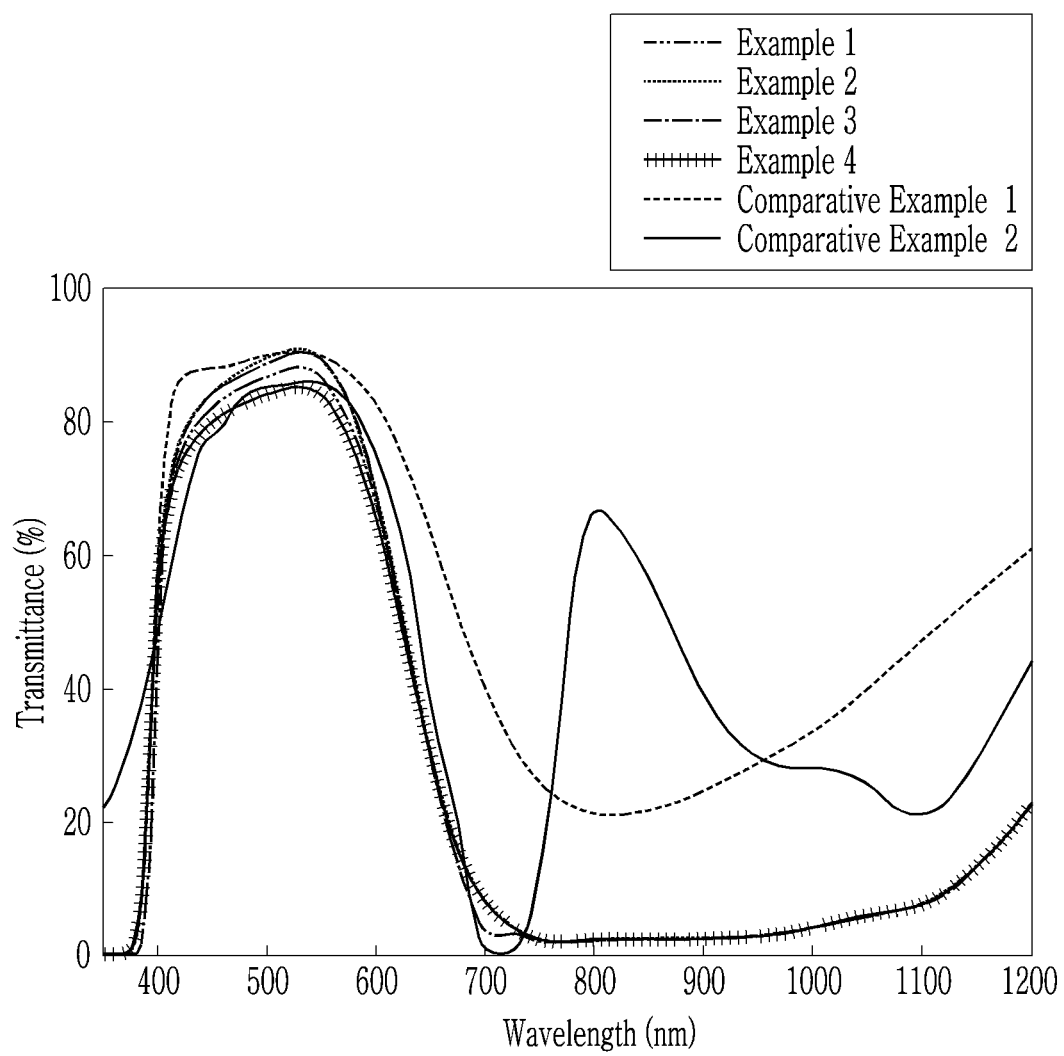
FIG. 17 is a graph showing a light transmittance verse a wavelength of the optical filters according to examples and comparative examples.

Light Transmittance of Optical Filters of Examples and Comparative Examples Depending on Wavelength Light transmittance characteristics of the optical filters according to Examples and Comparative Examples depending on a wavelength region are evaluated, and the results are shown in FIG. 17.

The light transmittance characteristics are evaluated by using a UV-Vis spectrophotometer (SoldiSpec-3700, Shimadzu Corp.).

FIG. 17 is a graph showing light transmittances of the optical filters according to Examples and Comparative Examples depending on a wavelength.

Referring to FIG. 17, the optical films according to Examples show excellent average light transmittance in a wavelength region ranging from 430 nm to 565 nm and simultaneously, excellent average light transmittance in a wavelength region of 700 nm to 740 nm, 700 nm to 1200 nm, and 1000 nm to 1200 nm compared with the optical films according to Comparative Examples.

The optical films including at least one anti-reflection layer show a little improved average light transmittance (about 5% to 7%) in a wavelength region ranging from 430 nm to 565 nm compared with the optical films not including at least one anti-reflection layer.

On the other hand, Table 4 shows average light transmittances of the optical films according to Examples and Comparative Examples in each wavelength region (430 nm to 565 nm, 700 nm to 740 nm, 700 nm to 1200 nm, and 1000 nm to 1200 nm) in FIG. 17.

TABLE 4

|  | 430 nm-565 nm [%] | 700 nm-740 nm [%] | 700 nm-1200 nm [%] | 1000 nm-1200 nm [%] |
|---|---|---|---|---|
| Example 1 | 86.0 | 4.8 | 5.8 | 10.0 |
| Example 2 | 88.4 | 4.8 | 5.7 | 9.8 |
| Example 3 | 88.0 | 3.1 | 5.6 | 9.9 |

TABLE 4-continued

| | 430 nm-<br>565 nm [%] | 700 nm-<br>740 nm [%] | 700 nm-<br>1200 nm [%] | 1000 nm-<br>1200 nm [%] |
|---|---|---|---|---|
| Example 4 | 82.7 | 4.8 | 5.8 | 10.1 |
| Comparative Example 1 | 89.2 | 33.3 | 34.7 | 47.3 |
| Comparative Example 2 | 82.9 | 1.1 | 35.8 | 27.8 |

Referring to Table 4, the optical films according to Comparative Examples 1 and 2 show excellent average light transmittance in a wavelength region of about 430 nm to about 565 nm but average light transmittance of 27% to 50% in at least one section out of the other near infrared ray wavelength regions (700 nm to 740 nm, 700 nm to 1200 nm, and 1000 nm to 1200 nm).

Accordingly, referring to Table 4, the optical filters according to Examples show excellent light transmittance in visible ray wavelength region and excellent light absorption capability in near infrared ray wavelength region compared with the optical films according to Comparative Examples.

While some example embodiments have been described, it is to be understood that inventive concepts not limited to the disclosed embodiments, but, on the contrary, are intended to cover various modifications and equivalent arrangements included within the spirit and scope of the appended claims.

What is claimed is:

1. An optical filter, comprising
a polymer film having a* of about −5.0 to about +5.0 and b* of about −5.0 to about +5.0, based on a color coordinate expressed by a CIE Lab color space; and
a near infrared absorption layer on the polymer film, the near infrared absorption layer being configured to transmit light in a visible region and to selectively absorb at least one part of light in a near infrared region,
the near infrared absorption layer including a first near infrared absorption material and a second near infrared absorption material,
the first near infrared absorption material including a copper phosphate ester compound,
the second near infrared absorption material including at least two different organic dyes, and
the second near infrared absorption material having a maximum absorption wavelength ($\lambda_{max}$) in a wavelength region of about 650 nm to about 1200 nm, wherein the second near infrared absorption material includes a binder,
the at least two different organic dyes of the second near infrared absorption material include an organic dye represented by Chemical Formula 1 and at least one of an organic dye represented by Chemical Formula 2 or an organic dye represented by Chemical Formula 3,

[Chemical Formula 1]

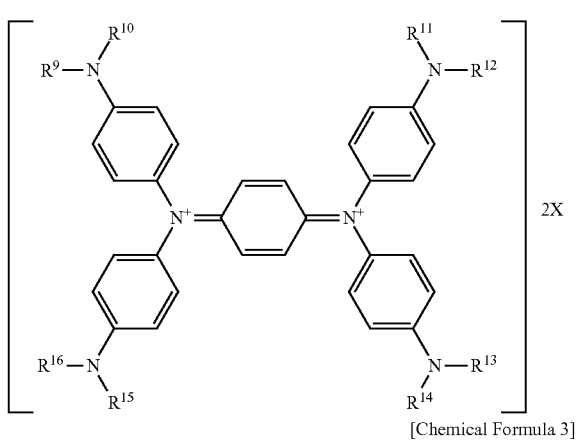

[Chemical Formula 2]

[Chemical Formula 3]

wherein, in Chemical Formula 1, Chemical Formula 2, and Chemical Formula 3, $R^1$ to $R^{26}$ are independently a hydrogen atom, a substituted or unsubstituted C1 to C20 alkyl group, or a substituted or unsubstituted C6 to C20 aryl group, X is one of $PF_6^-$, $BF_4^-$, $ClO_4^-$, $I^-$, or a borate-based anion, and n is an integer ranging from 1 to 10.

2. The optical filter of claim 1, wherein the organic dye represented by Chemical Formula 1 includes one or more structures represented by at least one of Chemical Formula 1a, Chemical Formula 1b, Chemical Formula 1c, Chemical Formula 1d, or Chemical Formula 1e:

[Chemical Formula 1a]

[Chemical Formula 1b]

[Chemical Formula 1c]

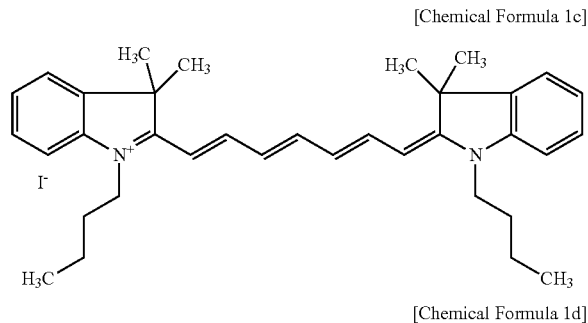

[Chemical Formula 1d]

[Chemical Formula 1e]

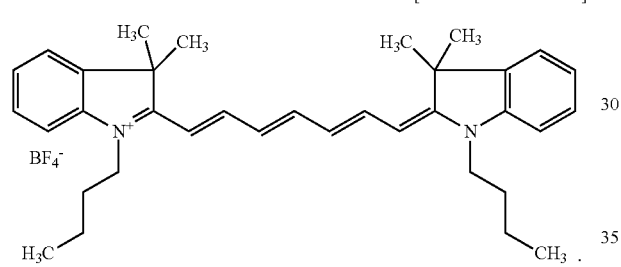

3. The optical filter of claim 1, wherein the organic dye represented by Chemical Formula 2 includes one or more structures represented by at least one of Chemical Formula 2a, Chemical Formula 2b, or Chemical Formula 2c:

[Chemical Formula 2a]

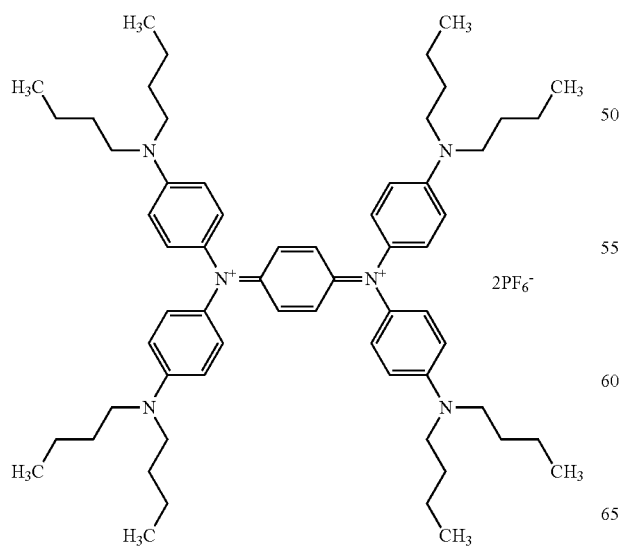

[Chemical Formula 2b]

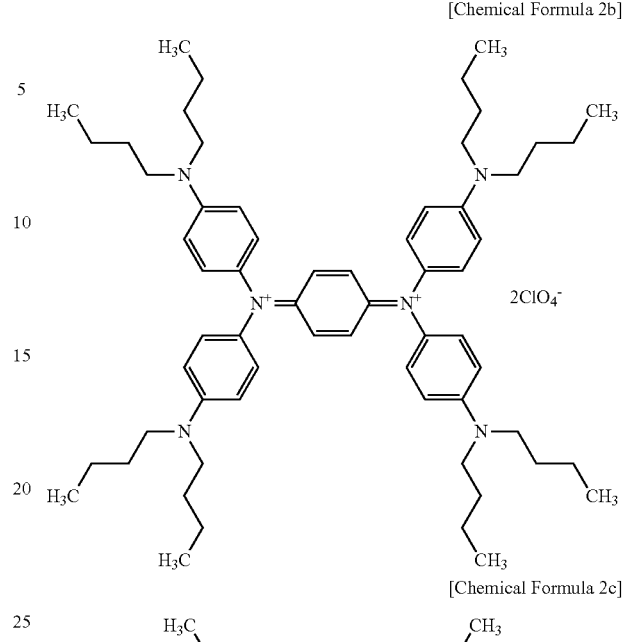

[Chemical Formula 2c]

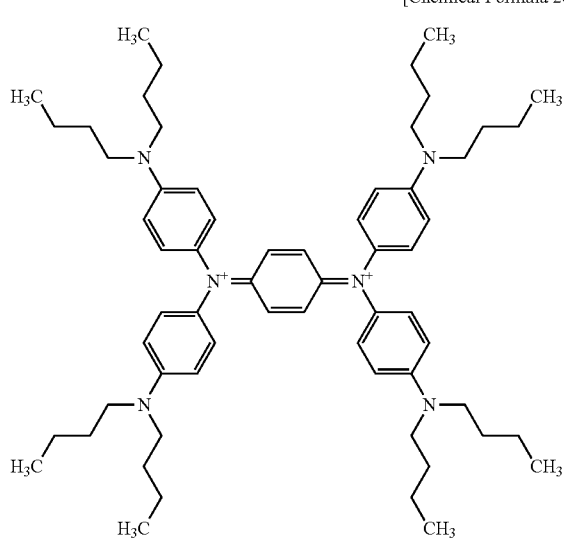

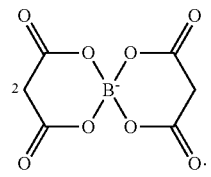

4. The optical filter of claim 1, wherein
the organic dye represented by Chemical Formula 1 has a maximum absorption wavelength ($\lambda_{max}$) in a wavelength region of about 700 nm to about 760 nm,
the organic dye represented by Chemical Formula 2 has a maximum absorption wavelength ($\lambda_{max}$) in a wavelength region of about 1050 nm to about 1100 nm, and
the organic dye represented by Chemical Formula 3 has a maximum absorption wavelength ($\lambda_{max}$) in a wavelength region of about 680 nm to about 720 nm.

5. The optical filter of claim 1, wherein the binder includes an acrylic binder, an epoxy binder, or a combination thereof.

6. The optical filter of claim 1, wherein
the organic dye represented by Chemical Formula 1 has an absorbance at a maximum absorption wavelength ($\lambda_{max}$) that is at least about 30 times as high as an absorbance of the organic dye represented by Chemical Formula 1 at a wavelength of about 550 nm, and the organic dye represented by Chemical Formula 2 has an absorbance at a maximum absorption wavelength ($\lambda_{max}$) that is at least about 15 times as high as an absorbance of the organic dye represented by Chemical Formula 2 at a wavelength of about 550 nm.

7. The optical filter of claim 1, wherein the copper phosphate ester compound is represented by Chemical Formula 4:

[Chemical Formula 4]

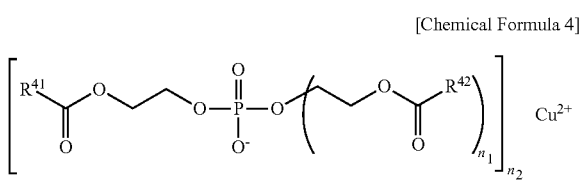

wherein, in Chemical Formula 4, $R^{41}$ and $R^{42}$ are independently one of a substituted or unsubstituted C1 to C20 alkyl group, a substituted or unsubstituted C2 to C20 alkenyl group, a substituted or unsubstituted C2 to C20 alkynyl group, or a substituted or unsubstituted C6 to C20 aryl group, $n_1$ is an integer of 0 or 1, and $n_2$ is an integer of 1 or 2.

8. The optical filter of claim 7, wherein the copper phosphate ester compound represented by Chemical Formula 4 includes one or more structures represented by at least one of Chemical Formula 4a, Chemical Formula 4b, Chemical Formula 4c, or Chemical Formula 4d:

[Chemical Formula 4a]

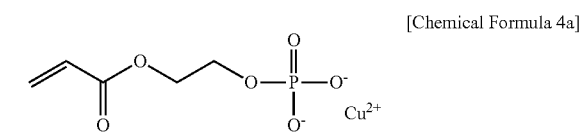

[Chemical Formula 4b]

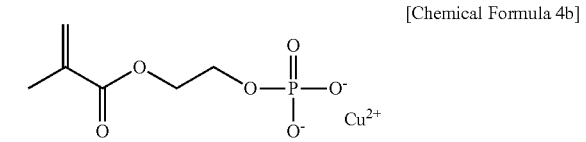

[Chemical Formula 4c]

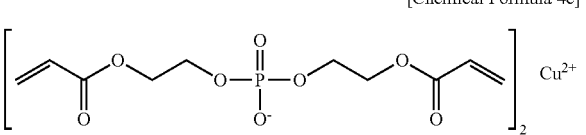

[Chemical Formula 4d]

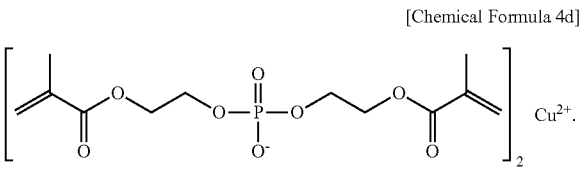

9. The optical filter of claim 1, wherein the near infrared absorption layer includes a first near infrared absorption layer and a second near infrared absorption layer, the first near infrared absorption layer consisting of the first near infrared absorption material, the second near infrared absorption layer consisting of the second near infrared absorption material, and the first near infrared absorption layer and the second near infrared absorption layer are separate layers from each other.

10. The optical filter of claim 9, wherein the first near infrared absorption layer is on the polymer film and the second near infrared absorption layer is on the first near infrared absorption layer.

11. The optical filter of claim 1, wherein the optical filter further includes an anti-reflection layer on at least one of one surface of the polymer film or one surface of the near infrared absorption layer.

12. The optical filter of claim 11, wherein the anti-reflection layer includes a first layer and a second layer, a refractive index of the first layer is different than a refractive index of the second layer, and the first layer and the second layer are alternately stacked two or more.

13. The optical filter of claim 11, wherein the optical filter includes an anti-reflection layer on the one surface of the polymer film and the one surface of the near infrared absorption layer, respectively.

14. The optical filter of claim 1, wherein the polymer film includes one of polyethyleneterephthalate, polyethylenenaphthalate, triacetyl cellulose, polycarbonate, a cycloolefin polymer, poly(meth)acrylate, polyimide, or a combination thereof.

15. The optical filter of claim 1, wherein a yellow index of the polymer film measured according to ASTM D1925 is less than or equal to about 10.

16. The optical filter of claim 1, wherein a haze of the polymer film is less than or equal to about 10%.

17. The optical filter of claim 1, wherein the optical filter has a thickness of about 25 μm to about 190 μm.

18. The optical filter of claim 17, wherein the optical filter has an average light transmittance of less than or equal to about 25% in a wavelength region of about 700 nm to about 1200 nm.

19. The optical filter of claim 17, wherein the optical filter has an average light transmittance of less than or equal to about 5% in a wavelength region of about 700 nm to about 740 nm, and the optical filter has an average light transmittance of less than or equal to about 25% in a wavelength region of about 1000 nm to about 1200 nm.

20. The optical filter of claim 17, wherein the optical filter has an average light transmittance of greater than or equal to about 80% in a wavelength region of about 430 nm to about 565 nm.

21. A camera module comprising
a lens;
an image sensor; and
the optical filter of claim 1 between the lens and the image sensor.

22. An electronic device comprising:
a substrate;
a photo-sensing device integrated with the substrate; and
the optical filter of claim 1 on the photo-sensing device.

23. An optical filter, comprising
a polymer film having a* of about −5.0 to about +5.0 and b* of about −5.0 to about +5.0, based on a color coordinate expressed by a CIE Lab color space; and
a near infrared absorption layer on the polymer film, the near infrared absorption layer including a first near infrared absorption layer and a second near infrared absorption layer,
the first near infrared absorption layer including a copper phosphate ester compound represented by Chemical Formula 4,

[Chemical Formula 4]

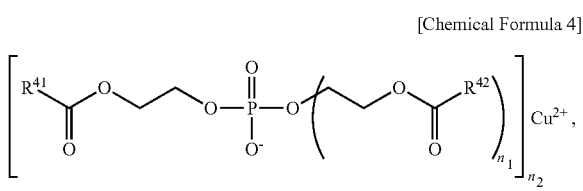

and
the second near infrared absorption layer including a binder and a plurality of organic dyes having a maximum absorption wavelength ($\lambda_{max}$) in a wavelength region of about 650 nm to about 1200 nm,
wherein, in Chemical Formula 4,
$R^{41}$ and $R^{42}$ are independently one of a substituted or unsubstituted C1 to C20 alkyl group, a substituted or unsubstituted C2 to C20 alkenyl group, a substituted or unsubstituted C2 to C20 alkynyl group, or a substituted or unsubstituted C6 to C20 aryl group,
$n_1$ is an integer of 0 or 1, and
$n_2$ is an integer of 1 or 2 wherein
the plurality of organic dyes include an organic dye represented by Chemical Formula 1 and at least one of an organic dye represented by Chemical Formula 2 or an organic dye represented by Chemical Formula 3,

[Chemical Formula 1]

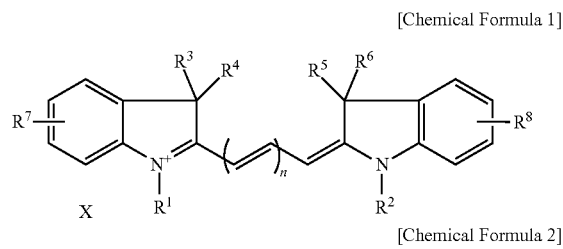

[Chemical Formula 2]

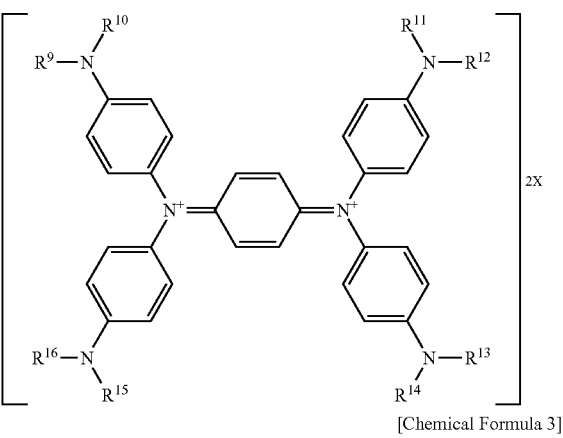

[Chemical Formula 3]

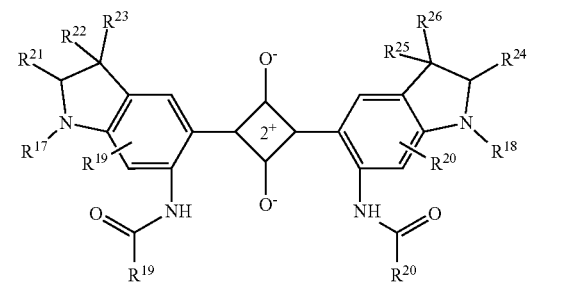

wherein, in Chemical Formula 1, Chemical Formula 2, and Chemical Formula 3, $R^1$ to $R^{26}$ are independently a hydrogen atom, a substituted or unsubstituted C1 to C20 alkyl group, or a substituted or unsubstituted C6 to C20 aryl group,
X is one of $PF_6^-$, $BF_4^-$, $ClO_4^-$, $I^-$, or a borate-based anion, and
n is an integer ranging from 1 to 10.

24. The optical filter of claim 23, wherein the copper phosphate ester compound represented by Chemical Formula 4 includes one or more structures represented by at least one of Chemical Formula 4a, Chemical Formula 4b, Chemical Formula 4c, or Chemical Formula 4d,

[Chemical Formula 4a]

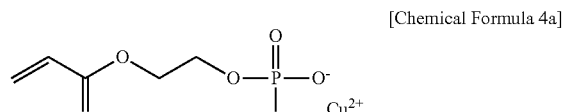

[Chemical Formula 4b]

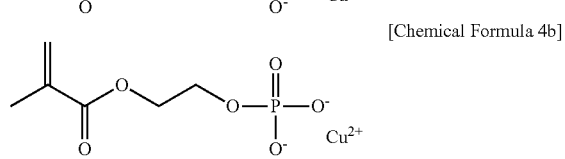

[Chemical Formula 4c]

[Chemical Formula 4d]

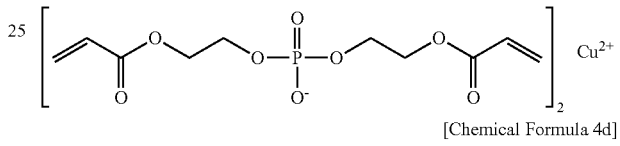

the plurality of organic dyes include a first organic dye represented by Chemical Formula 1 and at least one of a second organic dye represented by Chemical Formula 2 or a third organic dye represented by Chemical Formula 3,

[Chemical Formula 1]

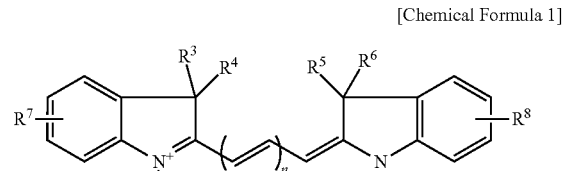

[Chemical Formula 2]

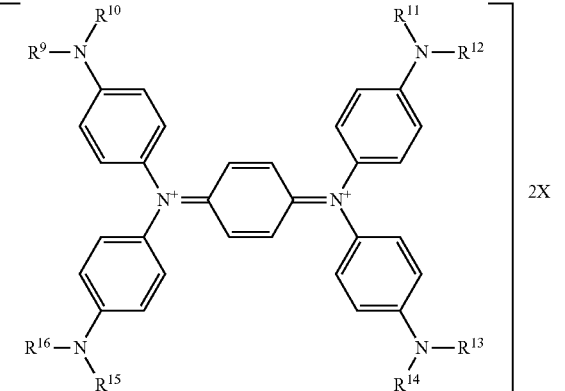

-continued

[Chemical Formula 3]

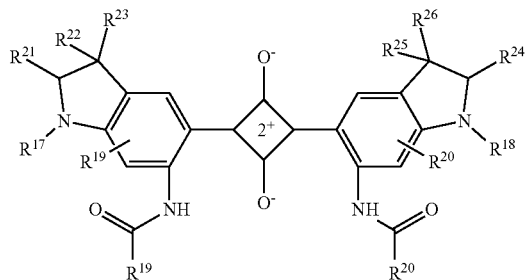

wherein, in Chemical Formula 1, Chemical Formula 2, and Chemical Formula 3, $R^1$ to $R^{26}$ are independently a hydrogen atom, a substituted or unsubstituted C1 to C20 alkyl group, or a substituted or unsubstituted C6 to C20 aryl group, X is one of $PF_6^-$, $BF_4^-$, $ClO_4^-$, $I^-$, or a borate-based anion, and n is an integer ranging from 1 to 10.

25. The optical filter of claim 23, further comprising at least one of:

a binder in the second near infrared absorption layer, or an anti-reflection layer on the polymer film.

26. An electronic device comprising:

a photoelectric device; and the optical filter of claim 23 on the photoelectric device.

27. An electronic device comprising:

a substrate;

a photo-sensing device integrated with the substrate; and the optical filter of claim 23 on the photo-sensing device.

* * * * *